United States Patent
Hagishima et al.

(10) Patent No.: US 8,476,690 B2
(45) Date of Patent: Jul. 2, 2013

(54) NONVOLATILE PROGRAMMABLE LOGIC SWITCHES AND SEMICONDUCTOR INTEGRATED CIRCUIT

(75) Inventors: Daisuke Hagishima, Kawasaki (JP); Atsuhiro Kinoshita, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 19 days.

(21) Appl. No.: 13/223,331

(22) Filed: Sep. 1, 2011

(65) Prior Publication Data

US 2012/0061731 A1 Mar. 15, 2012

(30) Foreign Application Priority Data

Sep. 10, 2010 (JP) .................................. 2010-203126

(51) Int. Cl.
*G11C 16/04* (2006.01)
*H01L 29/788* (2006.01)

(52) U.S. Cl.
USPC ................. 257/314; 365/185.27; 365/185.05; 257/326; 257/316

(58) Field of Classification Search
USPC ................................................. 257/314, 369
See application file for complete search history.

(56) References Cited

U.S. PATENT DOCUMENTS

| | | | |
|---|---|---|---|
| 6,756,632 B1 * | 6/2004 | Chen et al. | 257/316 |
| 6,834,009 B1 * | 12/2004 | Yue et al. | 365/185.05 |
| 7,368,789 B1 * | 5/2008 | Dhaoui et al. | 257/369 |
| 7,982,246 B2 * | 7/2011 | Cho et al. | 257/213 |

FOREIGN PATENT DOCUMENTS

| | | |
|---|---|---|
| JP | 6-76582 | 3/1994 |
| JP | 2003-68888 | 3/2003 |
| JP | 2009-509460 | 3/2009 |

OTHER PUBLICATIONS

U.S. Appl. No. 13/221,292, filed Aug. 30, 2011.
Notification of Reason for Rejection issued by the Japanese Patent Office on Aug. 21, 2012, for Japanese Patent Application No. 2010-203126, and English-language translation thereof.

* cited by examiner

*Primary Examiner* — Steven Loke
*Assistant Examiner* — David Goodwin
(74) *Attorney, Agent, or Firm* — Finnegan, Henderson, Farabow, Garrett & Dunner, L.L.P.

(57) ABSTRACT

A nonvolatile programmable logic switch according to an embodiment includes: a first semiconductor region of a first conductivity type and a second semiconductor region of a second conductivity type; a memory cell transistor including a first insulating film formed on the first semiconductor region, a charge storage film formed on the first insulating film, a second insulating film formed on the charge storage film, and a control gate formed on the second insulating film; a pass transistor including a third insulating film formed on the second semiconductor region, and a gate electrode formed on the third insulating film and electrically connected to the first drain region; a first electrode applying a substrate bias to the first semiconductor region, the first electrode being formed in the first semiconductor region; and a second electrode applying a substrate bias to the second semiconductor region, the second electrode being formed in the second semiconductor region.

10 Claims, 20 Drawing Sheets

| | FLOATING GATE (FG) | SUBSTRATE | PROGRAMMING | ERASING |
|---|---|---|---|---|
| FIRST EMBODIMENT | n+-TYPE POLYSILICON | n-WELL | $V_{CG}>0, V_{SUB}=0$ ELECTRONS ARE INJECTED FROM SUBSTRATE | $V_{CG}=0, V_{SUB}>0$ ELECTRONS ARE ERASED FROM FG |
| MODIFICATION OF FIRST EMBODIMENT | p+-TYPE POLYSILICON | n-WELL | $V_{CG}<0, V_{SUB}=0$ HOLES ARE INJECTED FROM INVERSION LAYER | $V_{CG}=0, V_{SUB}<0$ ELECTRONS ARE INJECTED INTO FG TO ERASE HOLES |
| SECOND EMBODIMENT | n+-TYPE POLYSILICON | p-WELL | $V_{CG}>0, V_{SUB}=0$ ELECTRONS ARE INJECTED FROM INVERSION LAYER | $V_{CG}=0, V_{SUB}>0$ ELECTRONS ARE ERASED FROM FG |
| MODIFICATION OF SECOND EMBODIMENT | p+-TYPE POLYSILICON | p-WELL | $V_{CG}<0, V_{SUB}=0$ HOLES ARE INJECTED FROM SUBSTRATE | $V_{CG}=0, V_{SUB}<0$ ELECTRONS ARE INJECTED INTO FG TO ERASE HOLES |

FIG. 21

|  |  | PROGRAMMING | ERASING |
|---|---|---|---|
| THIRD EMBODIMENT | pFET-TYPE MONOS | $V_{CG}<0, V_{SUB}=0$ HOLES ARE INJECTED FROM INVERSION LAYER | $V_{CG}=0, V_{SUB}<0$ ELECTRONS ARE INJECTED INTO CHARGE STORAGE LAYER TO ERASE HOLES |
| FOURTH EMBODIMENT | nFET-TYPE MONOS | $V_{CG}>0, V_{SUB}=0$ ELECTRONS ARE INJECTED FROM INVERSION LAYER | $V_{CG}=0, V_{SUB}>0$ ELECTRONS ARE ERASED FROM CHARGE STORAGE LAYER |

NONVOLATILE PROGRAMMABLE LOGIC SWITCHES AND SEMICONDUCTOR INTEGRATED CIRCUIT

CROSS-REFERENCE TO RELATED APPLICATION

This application is based upon and claims the benefit of priority from prior Japanese Patent Application No. 2010-203126 filed on Sep. 10, 2010 in Japan, the entire contents of which are incorporated herein by reference.

FIELD

Embodiments described herein relate generally to nonvolatile programmable logic switches and a semiconductor integrated circuit.

BACKGROUND

A programmable logic switch is a device that controls switching on and off of a logic switch in accordance with stored data. Normally, programmable logic switches are used in field programmable gate arrays (FPGAs) that require reconfiguration of logic operation circuits and wire circuits.

In each programmable logic switch used in FPGAs, a volatile memory such as a SRAM is used as a memory. Each SRAM includes a flip-flop unit that retains data, and an NMOS transistor that has the function to transmit information from bit lines to the flip-flop unit or retain the information in accordance with the bias conditions of word lines. Based on the information retained in the SRAM, switching on and off of the pass transistor is controlled. However, each SRAM is a volatile memory, and therefore, stored data is lost once the power is turned off. When the power is turned on again, it is necessary to read data from a memory region that is formed separately from the programmable logic switch, and to write information into the SRAM. Such a programmable logic switch including a SRAM has the problem of the circuit size of the SRAM and the problem of an increase in the circuit size due to the memory region required to be formed separately from the programmable logic switch. Those problems are particularly conspicuous in FPGAs that include a large number of programmable logic switches.

Nonvolatile programmable logic switches using nonvolatile memories have been suggested. For example, there has been a nonvolatile programmable logic switch including at least three transistors: a pMOS-type nonvolatile memory and an nMOS transistor are connected in series, and a switch device (an nMOS transistor) is combined with the pMOS-type nonvolatile memory and the nMOS transistor connected in series. The potential to be transferred to the gate electrode of the pass transistor is determined in accordance with the information to be written into the nonvolatile memory, and the switch device is controlled to be in an ON state or in an OFF state in accordance with the transferred potential.

BRIEF DESCRIPTION OF THE DRAWINGS

FIG. 7 is a diagram for explaining the bias conditions observed when external circuits are connected to the nonvolatile programmable logic switch of the first embodiment, and the pass transistor is switched on;

FIGS. 14(a) through 19(b) are cross-sectional views showing a method of manufacturing the logic switch of the first embodiment;

FIG. 21 is a diagram showing the program and erase conditions in the logic switches of the first and second embodiments;

FIG. 24 is a diagram showing the program and erase conditions in the logic switches of the third and fourth embodiments.

DETAILED DESCRIPTION

A nonvolatile programmable logic switch according to an embodiment includes: a device isolation region formed in a semiconductor substrate; a first semiconductor region of a first conductivity type and a second semiconductor region of a second conductivity type, the first semiconductor region and the second semiconductor region being formed in the semiconductor substrate and being isolated from each other by the device isolation region; a memory cell transistor including: a first source region and a first drain region formed in the first semiconductor region, the first source region and the first drain region being of the second conductivity type; a first insulating film formed on a portion of the first semiconductor region, the portion being located between the first source region and the first drain region; a charge storage film formed on the first insulating film; a second insulating film formed on the charge storage film; and a control gate formed on the second insulating film; a pass transistor including: a second source region and a second drain region formed in the second semiconductor region, the second source region and the second drain region being of the first conductivity type; a third insulating film formed on a portion of the second semiconductor region, the portion being located between the second source region and the second drain region; and a gate electrode formed on the third insulating film, the gate electrode being electrically connected to the first drain region; a first electrode applying a substrate bias to the first semiconductor region, the first electrode being formed in the first semiconductor region; and a second electrode applying a substrate bias to the second semiconductor region, the second electrode being formed in the second semiconductor region.

The following is a detailed description of embodiments with reference to the accompanying drawings.

First Embodiment

Figure 1:
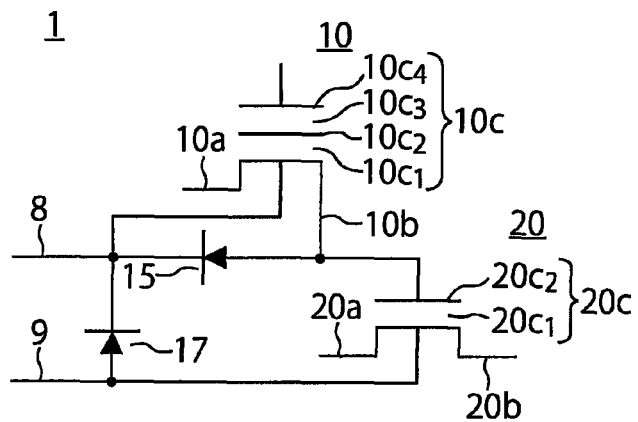
FIG. 1 is a circuit diagram showing a nonvolatile programmable logic switch according to a first embodiment.
Figure 2:
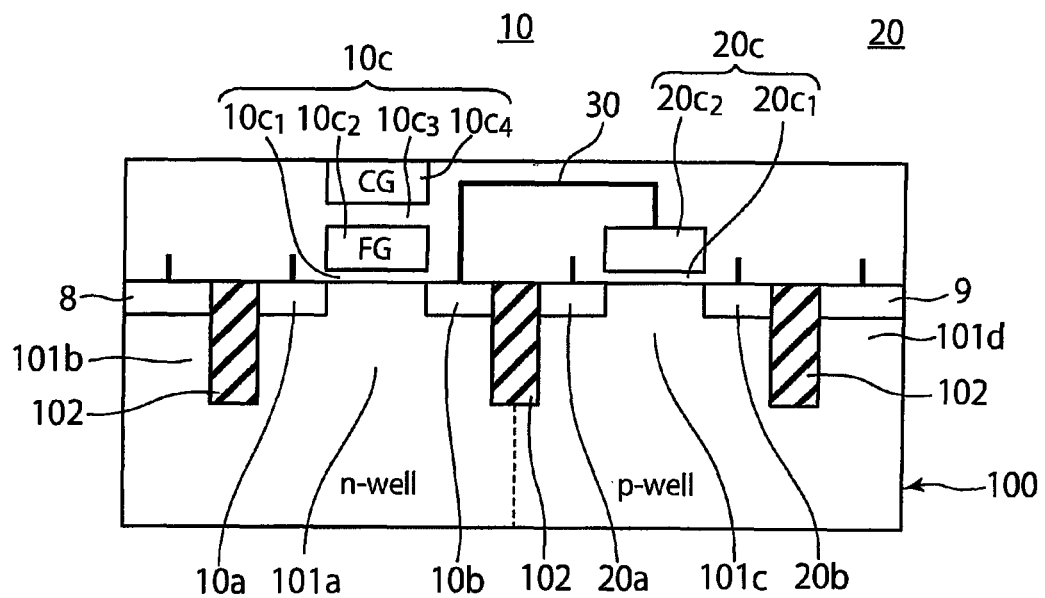
FIG. 2 is a circuit diagram showing a nonvolatile programmable logic switch according to the first embodiment.

FIG. 1 is a circuit diagram of a nonvolatile programmable logic switch (hereinafter also referred to simply as a logic switch) according to a first embodiment, and FIG. 2 is a cross-sectional view of the nonvolatile programmable logic switch. The logic switch 1 of this embodiment includes a memory cell transistor 10, a diode 15, a diode 17, and a pass transistor 20. The memory cell transistor 10 and the pass transistor 20 are formed in an n-well region 101a and a p-well region 101c of the same semiconductor substrate 100, respectively. A p$^+$-type impurity region 8 is formed in an n-well region 101b. The p$^+$-type impurity region 8 also serves as the terminal to be used for applying a substrate bias to the memory cell transistor 10. An n$^+$-type impurity region 9 is formed in a p-well region 101d. The n$^+$-type impurity region 9 also serves as the terminal to be used for applying a substrate bias to the pass transistor 20. That is, the p$^+$-type impurity region 8 and the n$^+$-type impurity region 9 should function as electrodes, and therefore, may be made of a metal compound such as Ni silicide, instead. The logic switch of this embodiment forms a cell that includes the memory cell transistor 10 and the pass transistor 20.

The well regions 101a, 101b, 101c, and 101d are isolated from one another by device isolation regions 102 made of an insulator. Here, the well regions are semiconductor regions, and may be part of a semiconductor substrate. Alternatively, the well regions may be formed by a SOI layer of a SOI (Silicon On Insulator) substrate.

The memory cell transistor 10 includes a p$^+$-type source region 10a and a p$^+$-type drain region 10b formed at a distance from each other in the n-well region 101a. A gate structure 10c that is a stack structure having a tunnel insulating film $10c_1$, a charge storage film $10c_2$, a block insulating film $10c_3$, and a control gate $10c_4$ stacked in this order is formed on the portion of the n-well region 101a serving as a channel between the source region 10a and the drain region 10b. The charge storage film $10c_2$ has a polysilicon film in this embodiment, and in this case, the charge storage film $10c_2$ is also called a floating gate. The charge storage film $10c_2$ may be a charge trapping film having an insulator that can trap charges, such as a silicon nitride film. The n-well region 101a and the p$^+$-type drain region 10b constitute the diode 15. The substrate bias is applied to the memory cell transistor 10 via the impurity region 8.

The pass transistor 20 also has an n$^+$-type source region 20a and an n$^+$-type drain region 20b formed at a distance from each other in the p-well region 101c. The pass transistor 20 further has a gate structure 20c that has a stack structure including a gate insulating film $20c_1$ and a gate electrode $20c_2$ stacked in this order on the portion of the p-well region 101c serving as a channel between the source region 20a and the drain region 20b.

The drain 10b of the memory cell transistor 10 is electrically connected to the gate electrode $20c_2$ of the pass transistor 20 via an wire 30. The n-well region 101a and the p-well region 101c constitute the diode 17. The substrate bias is applied to the pass transistor 20 via the impurity region 9.

In this embodiment, the pass transistor 20 is formed by an n-channel FET in which the length of the gate 20c is 50 nm, and the thickness of the gate insulating film $20c_1$ is 1.5 nm. The memory cell transistor 10 is formed by a p-channel FET in which the length of the gate 10c is 300 nm, and the thickness of the tunnel insulating film $10c_1$ is 8.0 nm. The floating gate $10c_2$ and the control gate $10c_4$ of the memory cell transistor 10 are made of n-type polysilicon, and program and erase operations are performed on the memory cell transistor 10 with the use of a FN (Fowler-Nordheim) current. Here, a case in which the floating gate and the control gate are made of polysilicon, and the gate insulating film and the interlayer insulating film are silicon oxide films or silicon oxynitride films is described. The floating gate and the control gate may be metal gates (made of a nitride or carbide of Ti, Ta, Mo, W, Rn, or the like), and the gate insulating film and the interlayer insulating film may be high-k films (insulating films having a higher dielectric constant than $SiO_2$ (silicon nitride films, or metal oxide films or metal oxynitride films containing a metal such as Hf or Zr)). With this arrangement, the Equivalent Oxide Thickness (EOT) can be made smaller. Accordingly, a high-performance nonvolatile programmable logic switch can be realized.

Next, operations of the logic switch of this embodiment are described.

Figure 3:
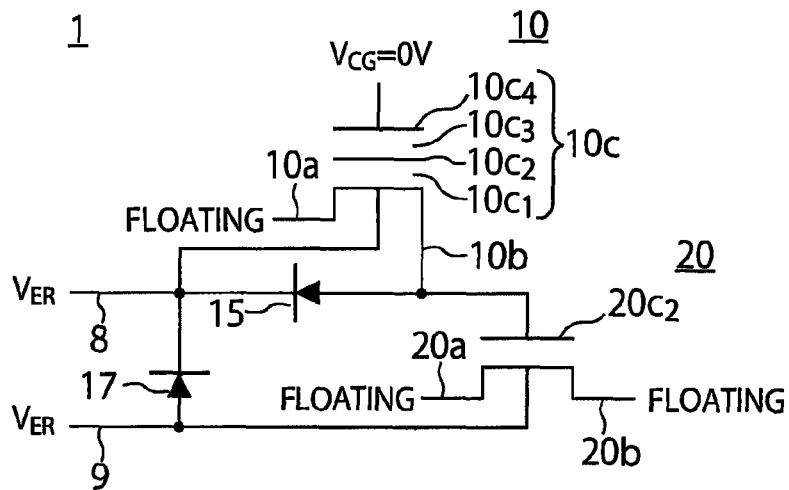
FIG. 3 is a diagram for explaining the bias conditions in an erase operation according to the first embodiment.

In this embodiment, the memory cell transistor 10 is put into an excessively erased state first. Electrons are then injected into the floating gate $10c_2$ as needed, to create a programmed state therein. FIG. 3 shows the bias conditions in an erasing operation in this embodiment. A voltage $V_{CG}=0$ V is applied to the control gate $10c_4$ of the memory cell transistor 10, the voltage $V_{SUB}$ to be applied to the substrate bias electrode (the terminal 8) is set at an erase voltage $V_{ER}$ (>0), and the source region 10a (the terminal 10a) is put into a floating state. As a result, the electric field in the tunnel insulating film $10c_1$ becomes more intense, and electrons are pulled out from the floating gate $10c_2$. That is, a FN current is supplied from the floating gate $10c_2$ to the substrate (the well regions). The memory cell transistor 10 is then put into an excessively erased state, and the potential $V_{FG}$ of the floating gate $10c_2$ become an effectively positive potential ($V_{FG}$>0V). At the same time, the voltage $V_{SUB}$ to be applied to the substrate bias electrode (the terminal 9) of the pass transistor 20 is set at the erase voltage $V_{ER}$, so that the gate insulating film $20c_1$ of the pass transistor 20 can be prevented from breaking. Since the voltage is applied to the terminal 9 to create an excessively erased state, an excessive erasing operation can be performed on the entire cell array having the structure of the logic switch 1 of this embodiment shown in FIG. 1 as each unit cell. The terminal 20a (the source region 20a) and the terminal 20b (the drain region 20b) should preferably be put into a floating state, or the substrate potential of each external circuit connected to the terminal 20a or the terminal 20b should preferably be put into a floating state. This is to prevent the potential $V_{ER}$ to have influence on the external circuits.

Figure 4:
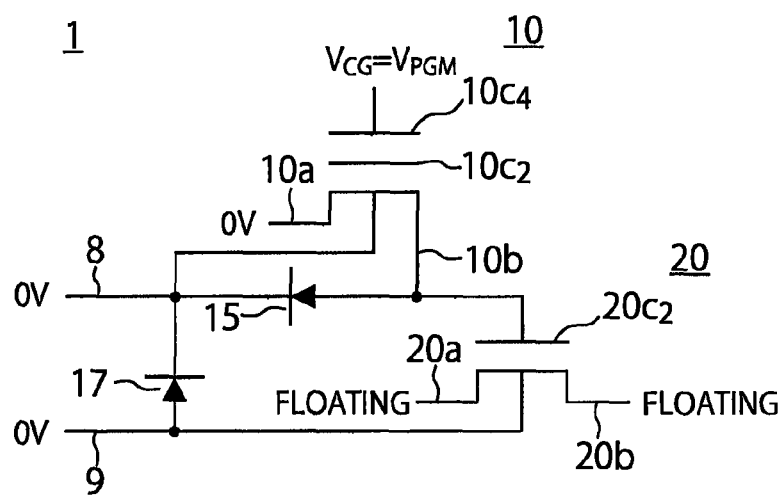
FIG. 4 is a diagram for explaining the bias conditions in a write operation according to the first embodiment.

FIG. 4 shows the bias conditions in a program operation in this embodiment. The voltages to be applied to the terminal 8 and the terminal 10a of the memory cell transistor 10 and the terminal 9 of the pass transistor 20 are set at 0 V, and a program voltage $V_{PGM}$ (>0) is applied to the control gate $10c_4$. Electrons are then injected into the floating gate $10c_2$ (a FN current flows from the n-well regions to the floating gate $10c_2$), and the potential $V_{FG}$ of the floating gate $10c_2$ becomes an effectively negative potential ($V_{FG}$<0 V). The terminal 20a and the terminal 20b should preferably be put into a floating state, or the substrate potential of each external circuit connected to the terminal 20a or the terminal 20b should preferably be put into a floating state. This operation is performed only on the unit cells requiring data writing in the cell array.

Figure 5:
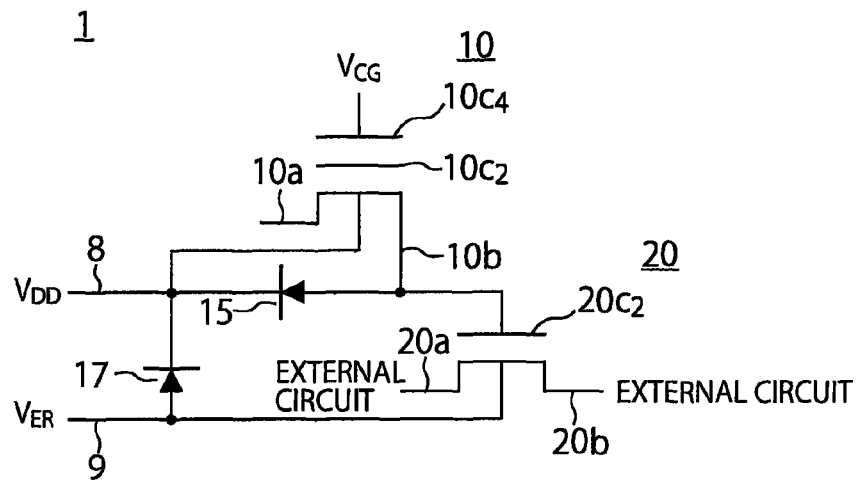
FIG. 5 is a diagram for explaining the bias conditions observed when external circuits are connected to the nonvolatile programmable logic switch according to the first embodiment.

As described above, after data is written into the memory cell transistor 10, the pass transistor 20 and external circuits are connected so that the nonvolatile programmable logic switch can operate. FIG. 5 illustrates a method of connecting the voltages to be applied to the nonvolatile programmable logic switch 1 of this embodiment to external circuits. As shown in FIG. 5, a drive potential $V_{DD}$ is applied to the terminal 8, 0 V is applied to the terminal 9, 0 V is applied to the terminal 10a, and the potential $V_{CG}$ is applied to the control gate $10c_4$. Although not clearly specified, the potential $V_{CG}$ may be set at an appropriate voltage in accordance with the design. In this manner, the pass transistor 20 is put into an ON/OFF state (a conduction/non-conduction state) in accordance with data written in the memory cell transistor 10. Accordingly, the external circuits connected to the terminal 20a and the terminal 20b can be electrically connected or put into a non-conduction state.

Figure 6:
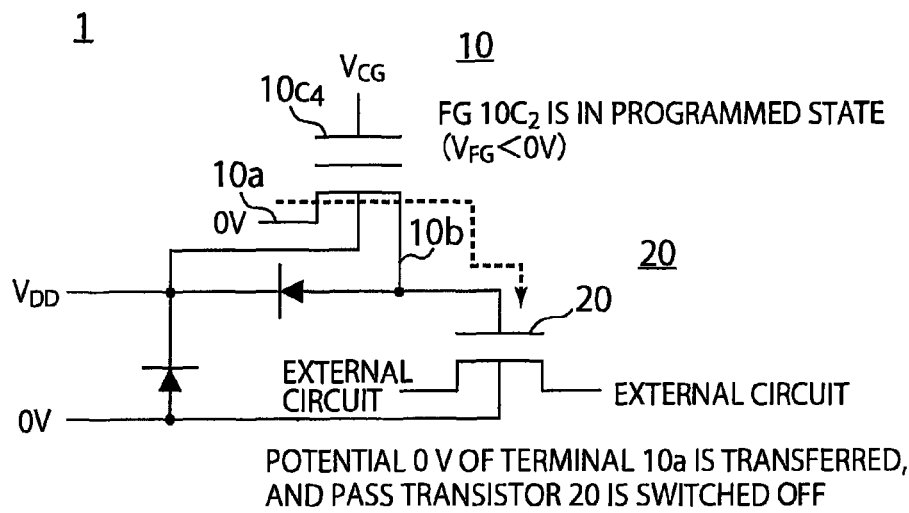
FIG. 6 is a diagram for explaining the bias conditions observed when external circuits are connected to the nonvolatile programmable logic switch of the first embodiment, and the pass transistor is switched off.

FIG. 6 shows the nonvolatile programmable logic switch 1 of this embodiment observed after electrons are written into the floating gate $10c_2$ of the memory cell transistor 10. Since the floating gate $10c_2$ is negatively charged by the electrons, the memory cell transistor 10 as a p-channel FET is put into an ON state. As a result, the potential 0 V applied to the terminal 10a is transferred to the gate $20c_2$ of the pass transistor 20, and the external circuits connected to the terminal 20a and the terminal 20b are electrically put into a non-conduction state.

Figure 7:
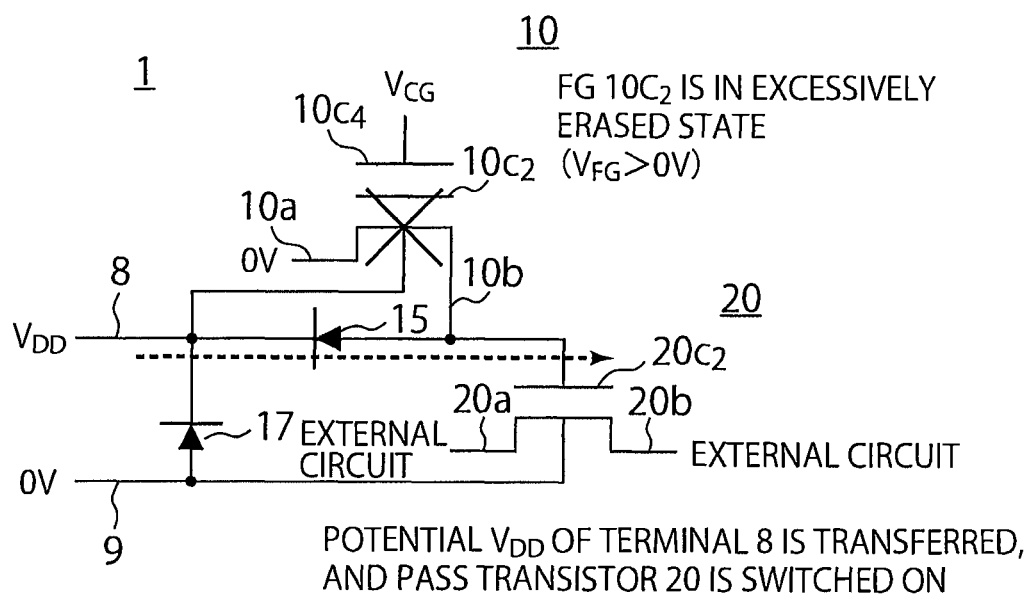

FIG. 7 shows the nonvolatile programmable logic switch 1 of this embodiment observed while the memory cell transistor 10 remains in an excessively erased state. By pulling out electrons from the floating gate $10c_2$, the floating gate $10c_2$ is positively charged, and accordingly, the memory cell transistor 10 as a p-channel FET is put into an OFF state. Therefore, the potential 0 V of the terminal 10a is not transferred to the gate electrode $20c_2$ of the pass transistor 20. Instead, the potential $V_{DD}$ applied to the terminal 8 is transferred to the gate electrode $20c_2$ of the pass transistor 20 via the pn diode 15 located between the substrate bias electrode (the terminal 8) of the memory cell transistor 10 and the drain 10b (the terminal 10b) or the gate electrode of the pass transistor 20. Since the floating gate $10c_2$ is also positively charged, the potential of the gate $20c_2$ of the pass transistor 20 can also remain positive by virtue of the capacitance coupling between the floating gate $10c_2$ and the impurity region 10b of the memory cell transistor 10. Accordingly, the pass transistor 20 is put into an ON state, and the external circuits connected to the terminal 20a and the terminal 20b are electrically put into a conduction state.

In the case illustrated in FIG. 7, the memory cell transistor 10 is in an OFF state, and therefore, the gate electrode $20c_2$ of the pass transistor 20 is in a floating state. Therefore, it is generally a matter of concern that the potential of the terminal 10b might fluctuate due to capacitance coupling with an external signal input to the terminal 20a, and the pass transistor 20 might malfunction. However, this embodiment does not have any malfunctions, for the following reasons.

Figure 8:
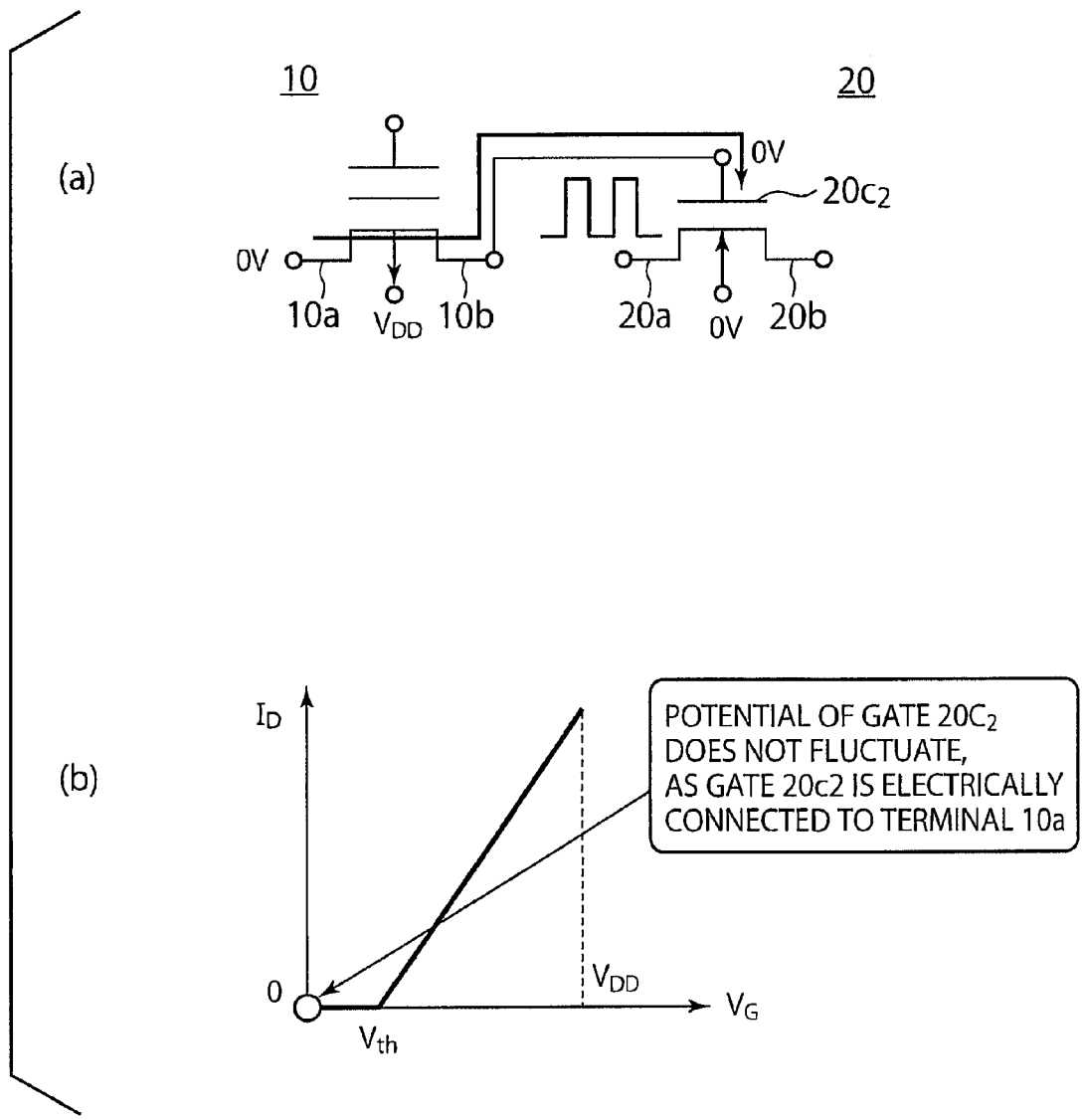
FIGS. 8(a) and 8(b) are diagrams for explaining that the pass transistor does not have malfunctions even when an external signal fluctuates.

To facilitate understanding, a case in which the memory cell transistor 10 is in an ON state is again described. FIG. 8(a) shows a situation where a potential 0 V is transferred to the gate $20c_2$ of the pass transistor 20. FIG. 8(b) demonstratively shows the switching characteristics of the pass transistor 20. The symbol O represents the gate potential where t is 0. Where t is larger than 0, an external signal is input to the terminal 20a or the terminal 20b. As described above with reference to FIG. 6, the potential of the gate $20c_2$ of the pass transistor 20 is connected to 0 V. Therefore, even when an external signal is input through the terminal 20a or the terminal 20b, the gate potential does not fluctuate due to capacitance coupling.

Figure 9:
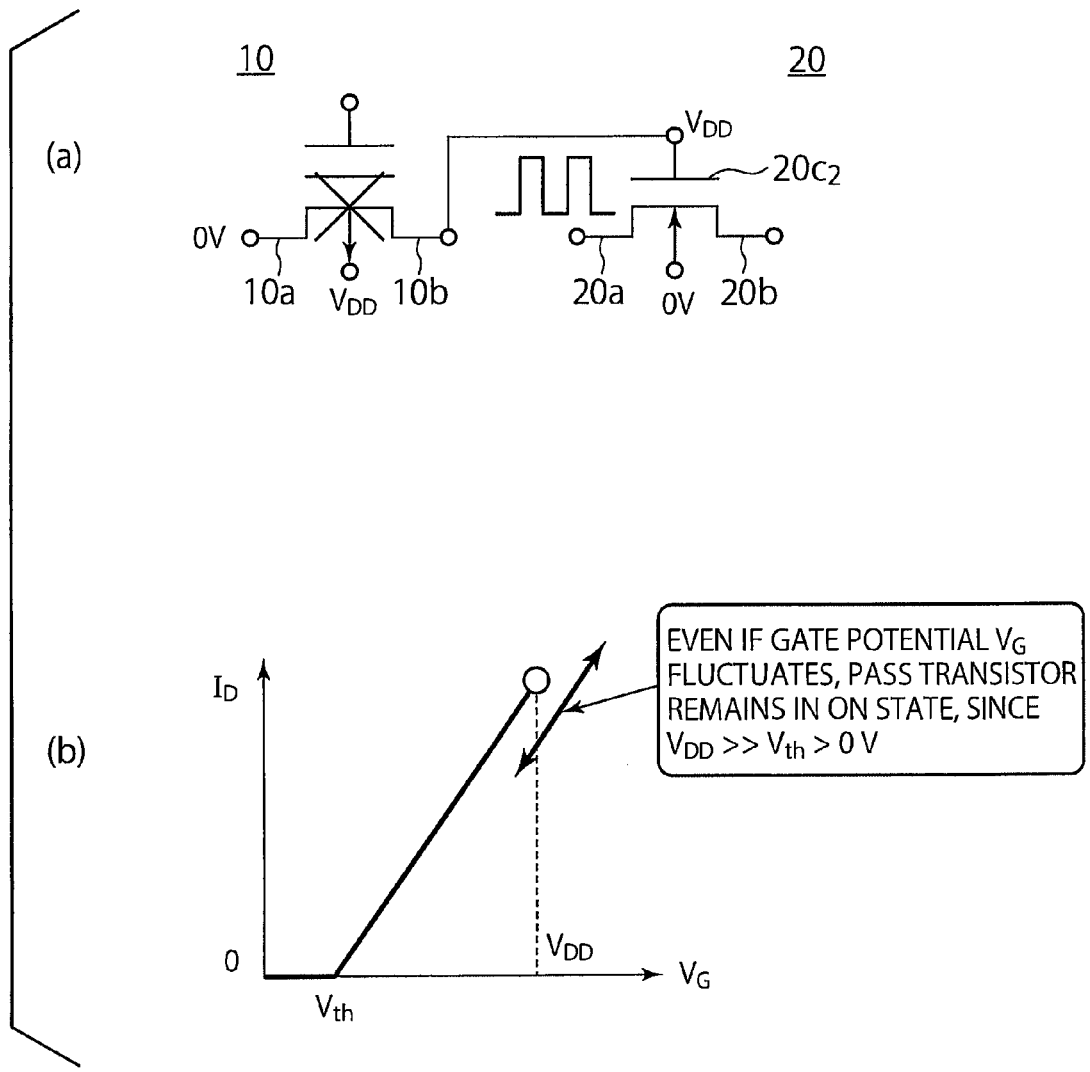
FIGS. 9(a) and 9(b) are diagrams for explaining that the pass transistor does not have malfunctions even when an external signal fluctuates.

FIG. 9(a) shows a situation where the memory cell transistor 10 is in an OFF state, and the potential $V_{DD}$ is transferred to the gate $20c_2$ of the pass transistor 20. FIG. 9(b) demonstratively shows the switching characteristics of the pass transistor 20. The symbol O represents the potential of the gate $20c_2$ where t is 0. Since the gate $20c_2$ of the pass transistor 20 is in a floating state, the potential of the gate $20c_2$ fluctuates by $\pm\Delta V$ due to capacitance coupling, depending on external signals. If a threshold voltage Vth is close to $V_{DD}$, the potential $V_G$ ($=V_{DD}-\Delta V$) of the gate $20c_2$ of the pass transistor 20 might become smaller than Vth due to a fluctuation in potential. That is, even if the user writes data into the memory cell transistor 10 so that the terminal 20a and the terminal 20b are electrically connected, a fluctuation in potential occurs due to an external signal, and the pass transistor 20 is put into an OFF state over time. However, the threshold voltage Vth is normally designed to be sufficiently lower than $V_{DD}$. Therefore, even if a fluctuation in potential occurs, $V_{DD}-\Delta V$ becomes larger than Vth, and malfunctions of the pass transistor 20 can be prevented. The lower the threshold voltage Vth is with respect to $V_{DD}$, the more advantageous this feature is. Therefore, in this embodiment, a high-speed device with a low threshold voltage Vth is preferably used as the pass transistor 20.

In the logic switch of this embodiment, the memory cell transistor 10 is first put into an excessively erased state, and programming is then performed on the memory cell transistor 10 as needed, to put the memory cell transistor 10 into a programmed state. Since the ON/OFF state (the conduction/non-conduction state) of the memory cell transistor 10 is determined by the programmed state of the memory cell transistor 10 (the charge-stored state of the floating gate $10c_2$), the pass transistor 20 can be controlled by applying the drive voltage $V_{DD}$ to the source region 10a.

In the nonvolatile programmable logic switch of this embodiment, the n-well region 101a having the memory cell transistor 10 formed thereon and the p-well region 101c having the pass transistor 20 formed thereon are adjacent to each other and form the pn junction 17, as shown in FIG. 2. Even if the distance between the memory cell transistor 10 and the pass transistor 20 is long, the circuit layout shown in FIG. 1 can be realized. In this case, however, the nonvolatile programmable logic does not function easily. This is because, the longer the distance becomes, the more difficult the transfer of the potential $V_{DD}$ to the terminal 10b by the parasitic capacitance becomes.

The pn junction 17 has the following advantages. In an erase operation in the nonvolatile programmable logic switch of this embodiment shown in FIG. 2, the substrate bias $V_{ER}$ needs to be applied to the memory cell transistor 10 and the pass transistor 20 via the terminal 8 and the terminal 9, as shown in FIG. 3. This is to protect the gate insulating film of the pass transistor 20 from breakdown. Therefore, to achieve the breakdown preventing effect, the voltage should preferably be applied to the terminal 8 and the terminal 9 at the same time as long as it is possible.

As shown in FIG. 2, the n-well region 101a having the memory cell transistor 10 formed thereon and the p-well region 101c having the pass transistor 20 formed thereon are adjacent to each other in this embodiment. Therefore, even if there is a time lag between the voltage application to the terminal 8 and the voltage application to the terminal 9, the potential is propagated also through the pn junction 17 between the n-well region 101a and the p-well region 101c, and the influence of the time lag can be minimized. In a case in which the distance between the memory cell transistor 10 and the pass transistor 20 is long, on the other hand, the timing to effectively apply a voltage to the n-well region and the p-well region greatly depends on the distance from the substrate contact, if the memory cell transistor 10 and the pass transistor 20 are laid out as separate arrays. Therefore, the time lag might become even longer, depending on the locations of the memory cell transistor 10 and the pass transistor 20.

Figure 10:
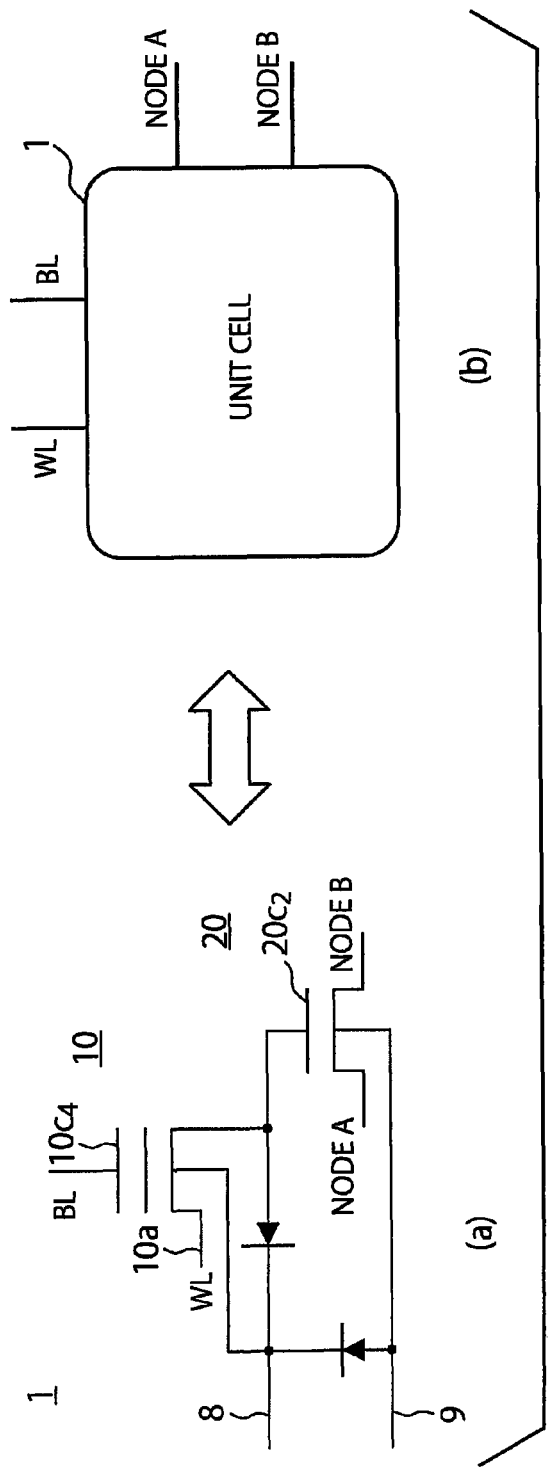
FIGS. 10(a) and 10(b) are diagrams for explaining unit cells.
Figure 11:
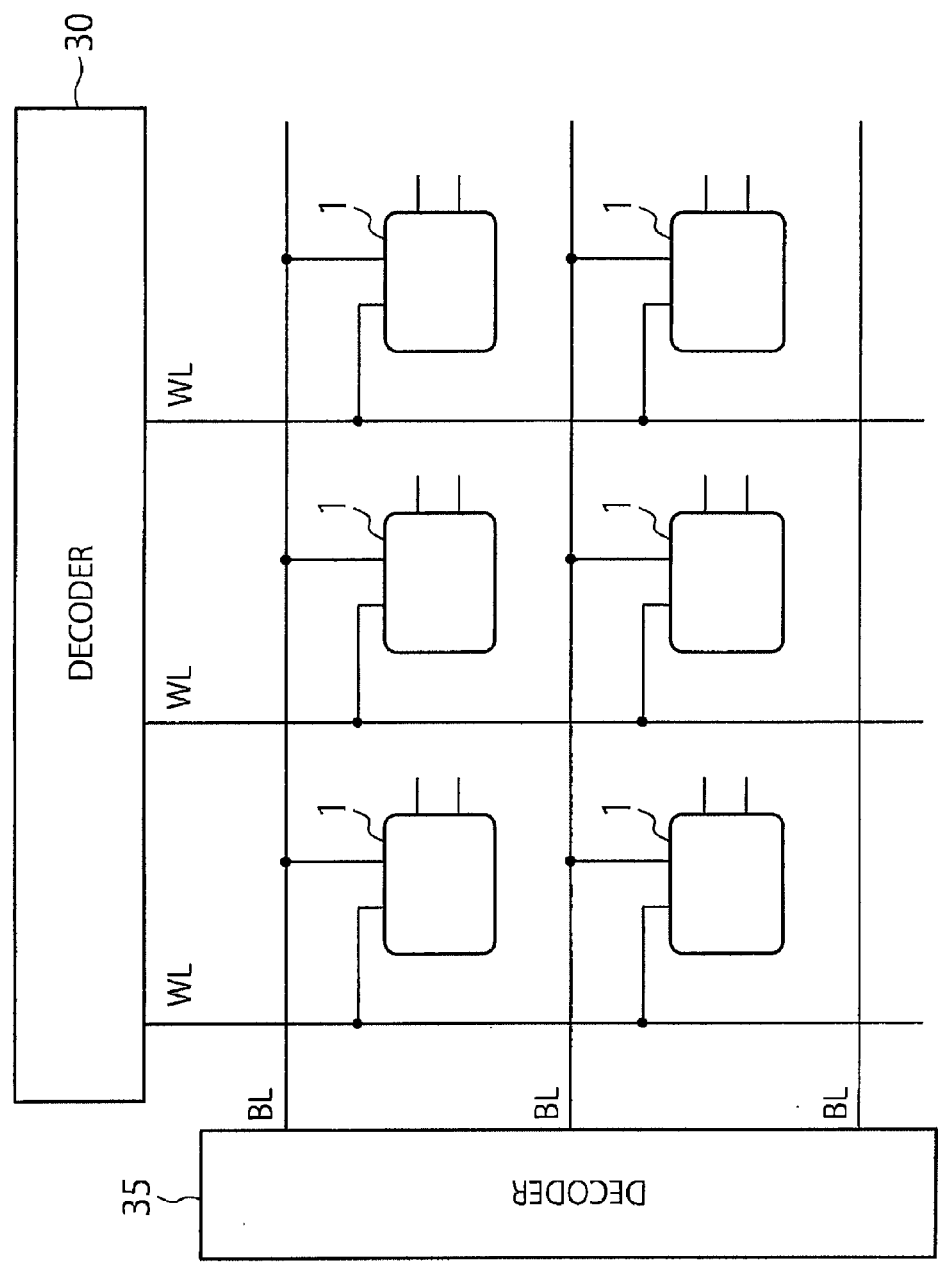
FIG. 11 is a diagram showing a semiconductor integrated circuit having the unit cells arranged in an array.

The above described nonvolatile programmable logic switch 1 of this embodiment functions as a unit cell 1 that is the smallest component unit that includes the memory cell transistor 10 and the pass transistor 20, as shown in FIGS. 10(a) and 10(b). A bit line BL is connected to the control gate $10c_4$ of the memory cell transistor 10, and a word line WL is connected to the source 10a. The source terminal 20a and the drain terminal 20b of the pass transistor 20 serve as a node A and a node B, respectively. The same unit cells as the unit cell 1 can be arranged in an array (in a matrix form) to form a semiconductor integrated circuit, as shown in FIG. 11. In doing so, the substrate bias electrode 8 of the memory cell transistor 10 and the substrate bias electrode 9 of the pass transistor 20 can be shared with the other unit cells. The terminal 8 and the terminal 9 can be shared in practice, though the two substrate bias electrodes (the terminal 8 and the terminal 9) are shown in the single unit cell 1 in FIG. 2. Accordingly, the circuit size can be reduced greatly. As shown in FIG. 11, each word line WL is connected to a decoder 30, and each bit line BL is connected to a decoder 35. The decoder 30 selects at least one word line WL by decoding an address signal, and the decoder 35 selects at least one bit line BL by decoding an address signal. In this manner, the unit cell 1 existing in the vicinity of the intersecting region between the selected word line WL and the selected bit line BL is selected.

Figure 12:
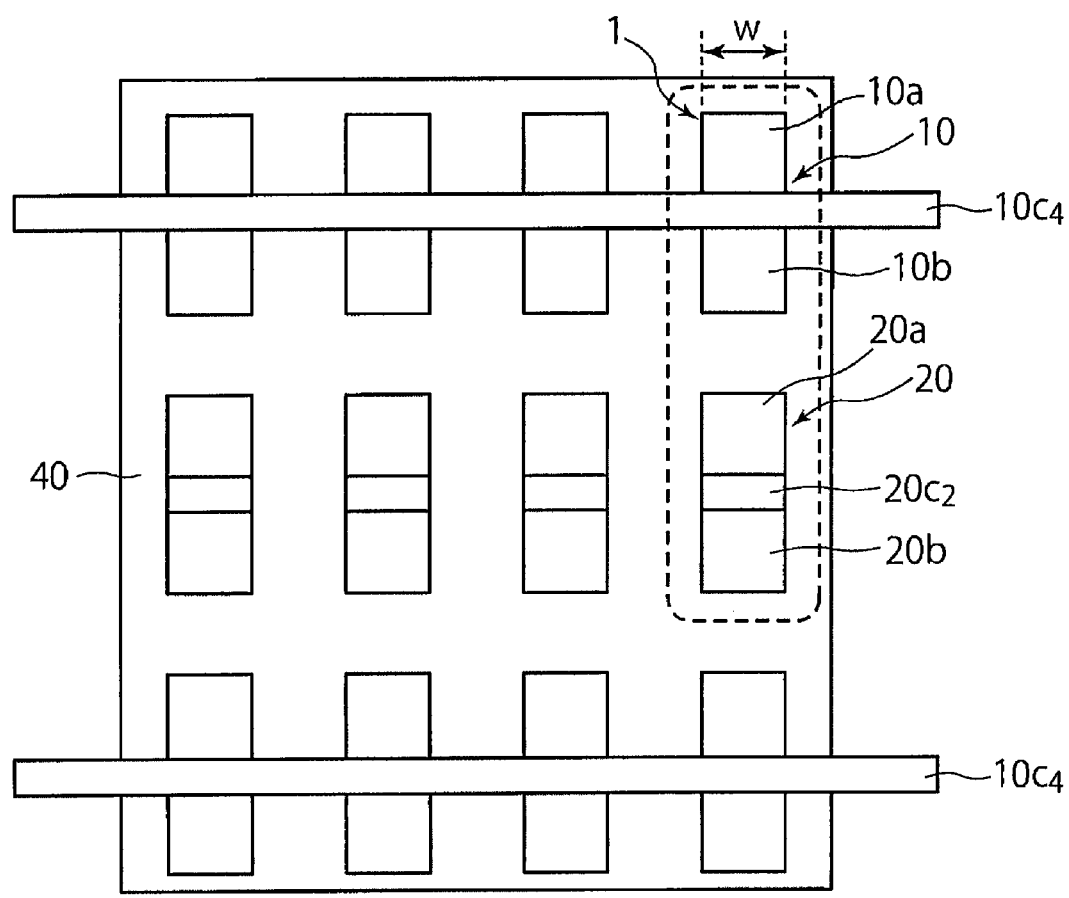
FIG. 12 is a diagram showing a specific example of the layout of the semiconductor integrated circuit having the unit cells of the first embodiment.

FIG. 12 shows the layout of a specific example of a semiconductor integrated circuit including unit cells 1 of this embodiment. In this specific example, the unit cells 1 are arranged in a matrix form, and the memory cell transistors 10 of the unit cells 1 of the same row are positioned so as to share a gate $10c_4$. The pass transistor 20 of each unit cell 1 and the memory cell transistor 10 in the same unit cell 1 are arranged in the same column. An insulating film 40 made of $SiO_2$, for example, is formed between each memory cell transistor 10 and each corresponding pass transistor 20.

Figure 13:
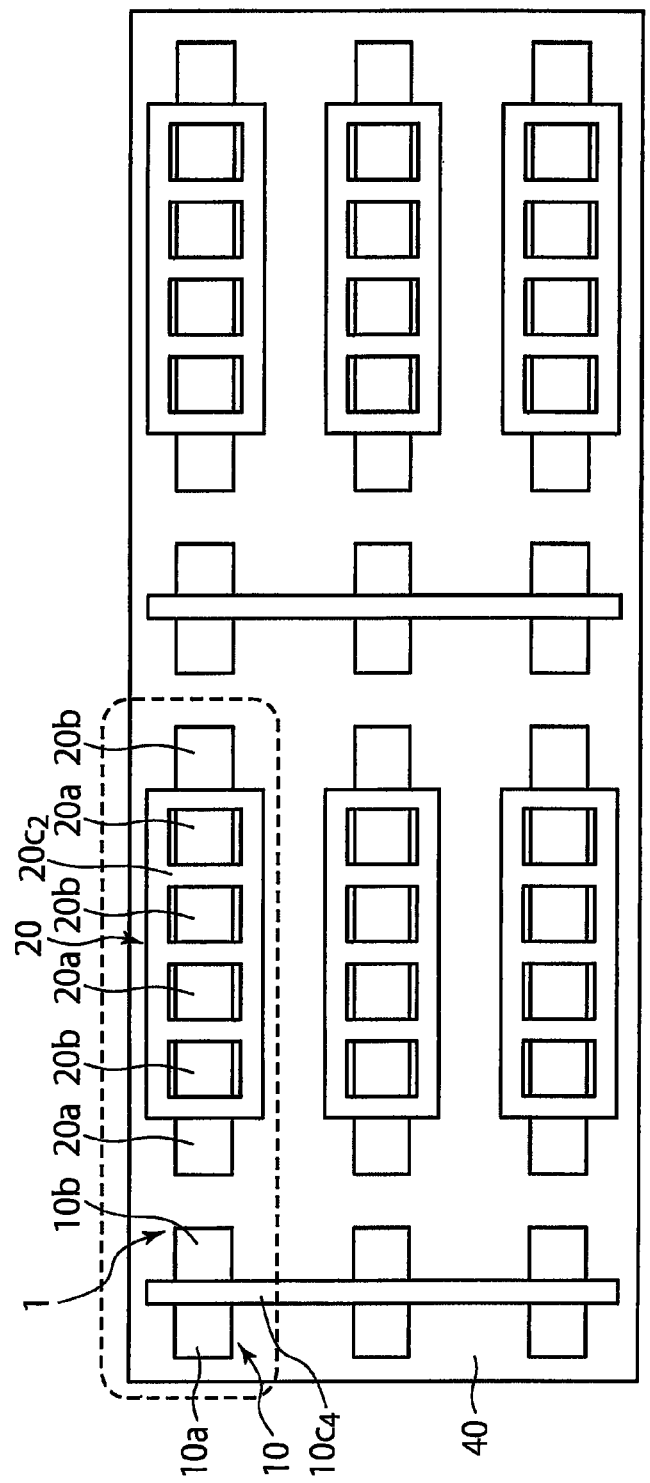
FIG. 13 is a diagram showing another specific example of the layout of the semiconductor integrated circuit having the unit cells of the first embodiment.
Figure 14:
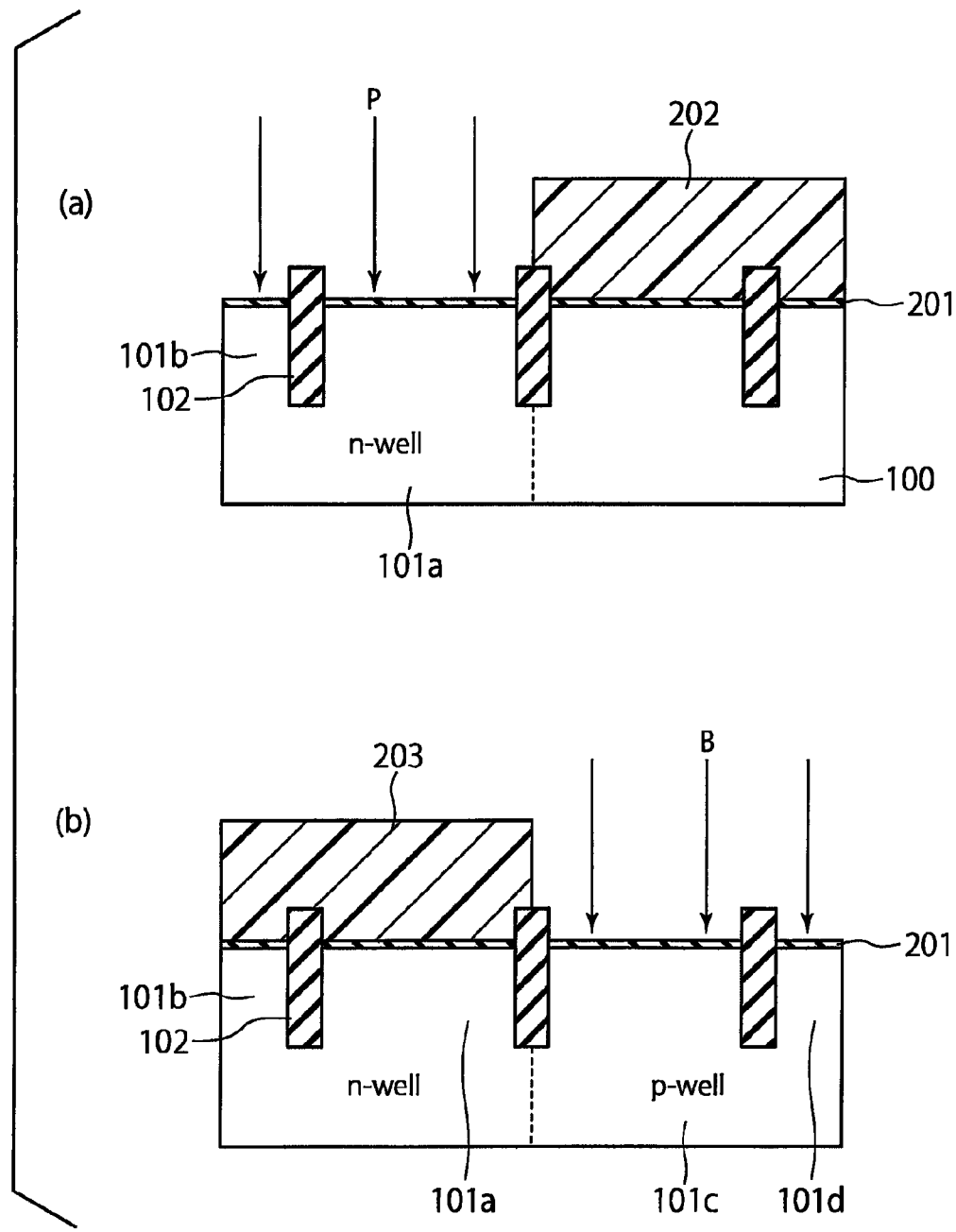
Figure 15:
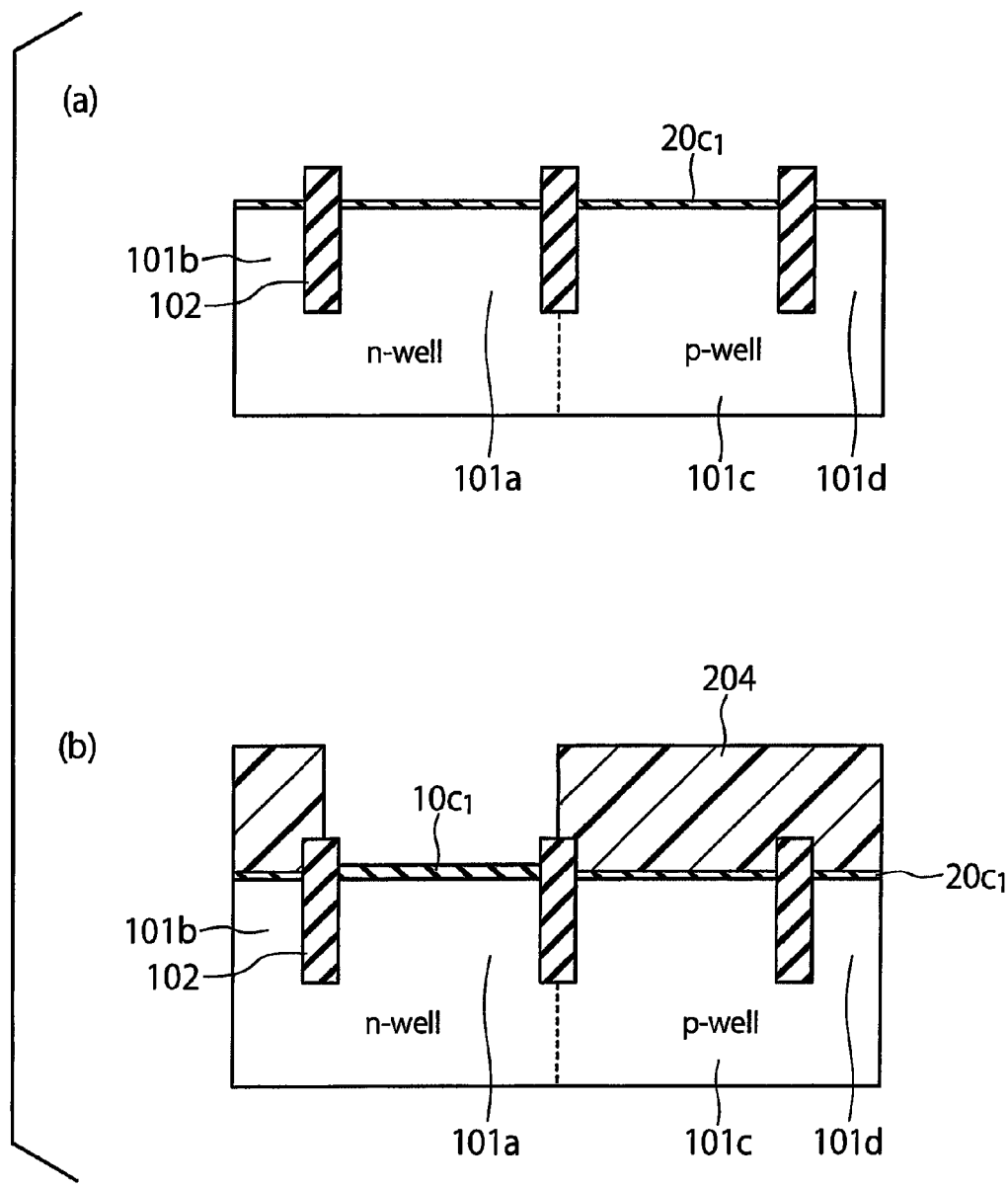
Figure 16:
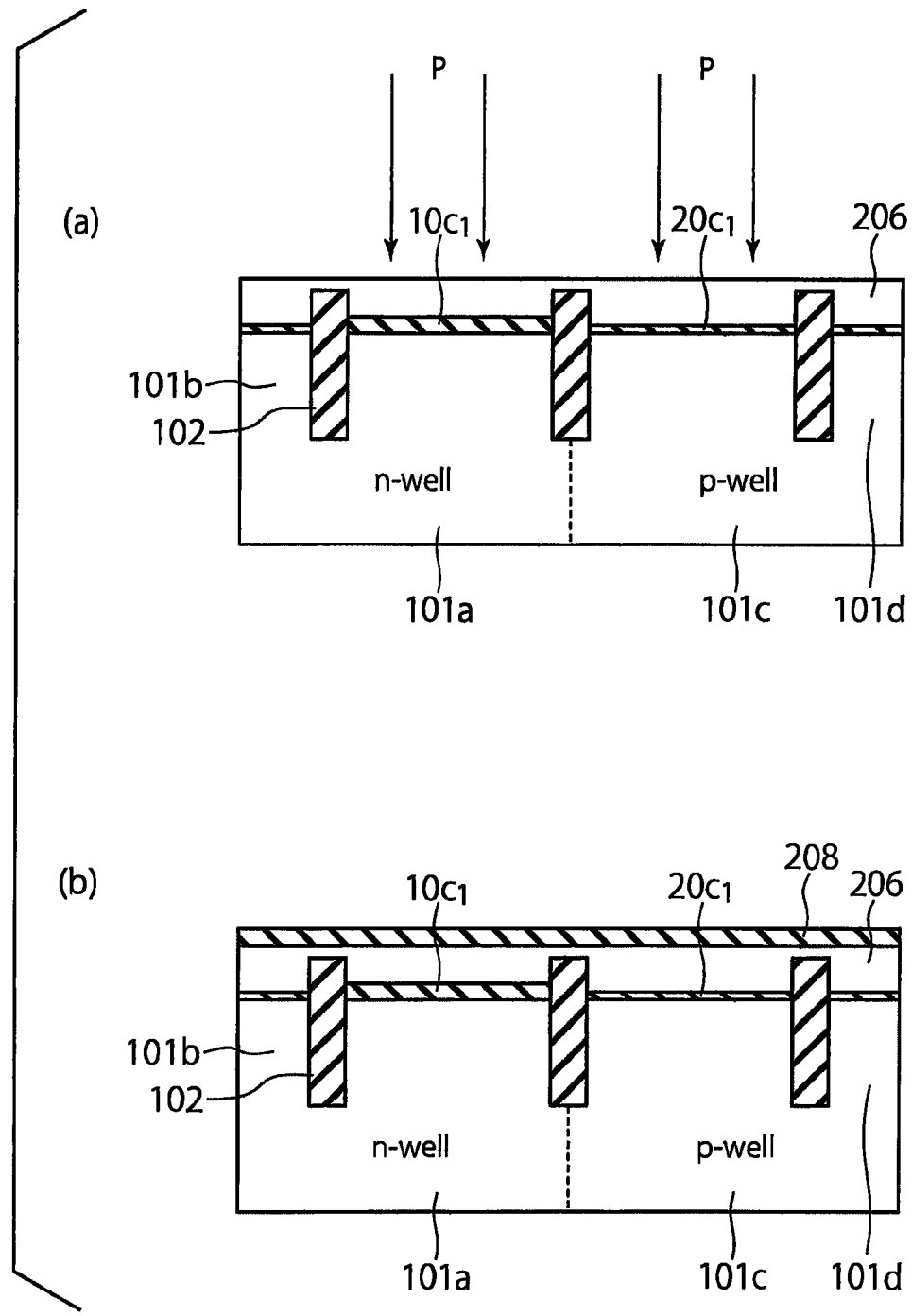
Figure 17:
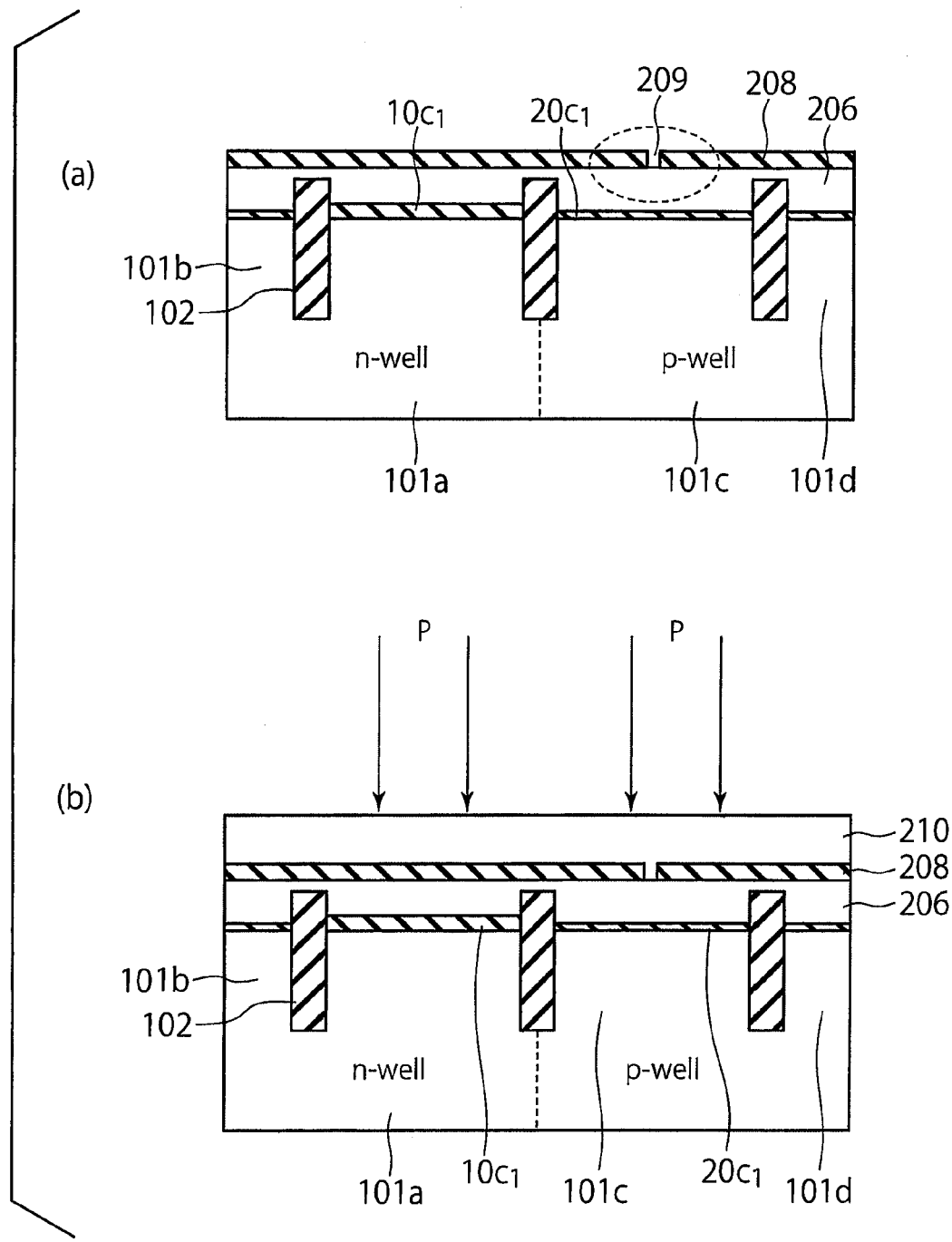
Figure 18:
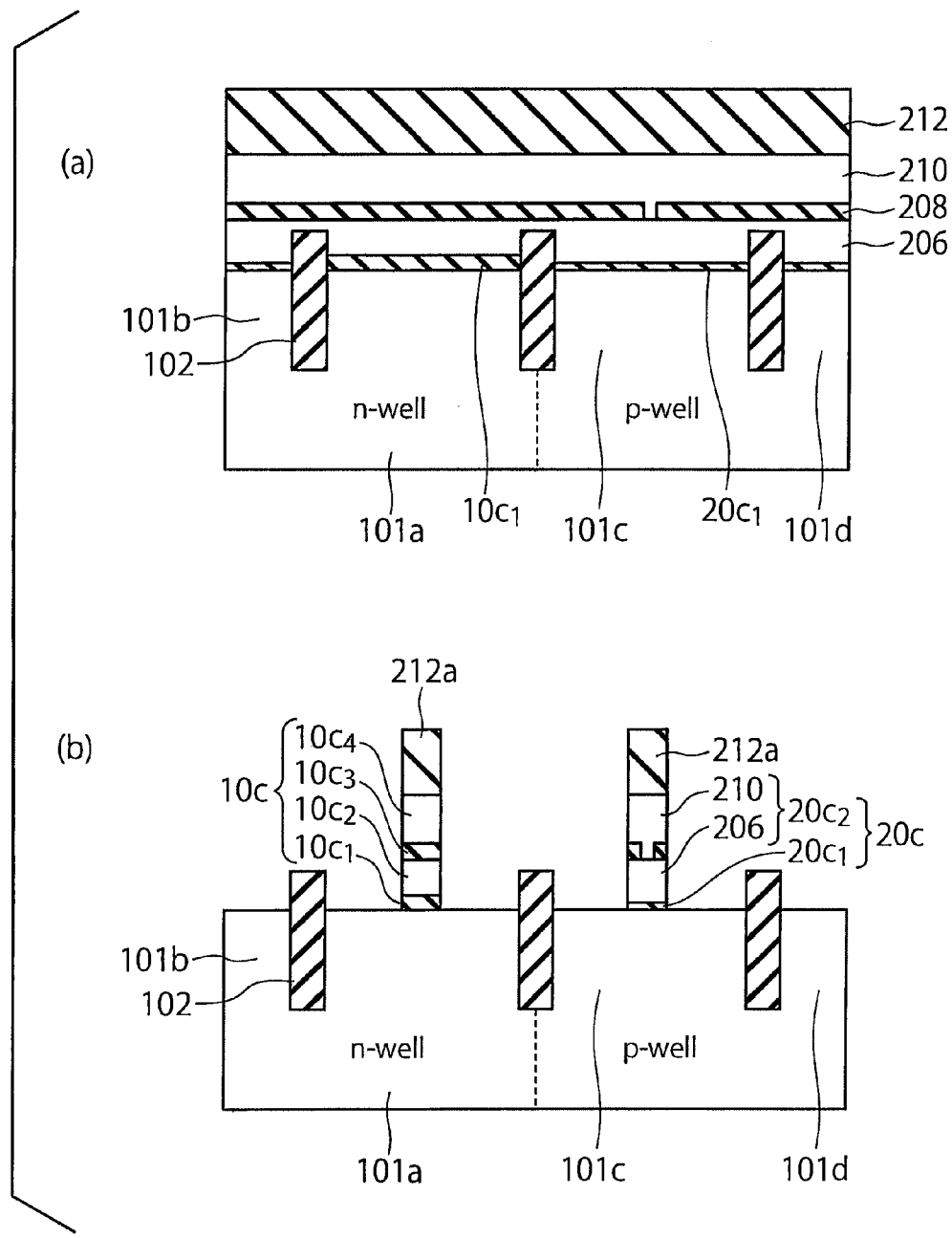
Figure 19:
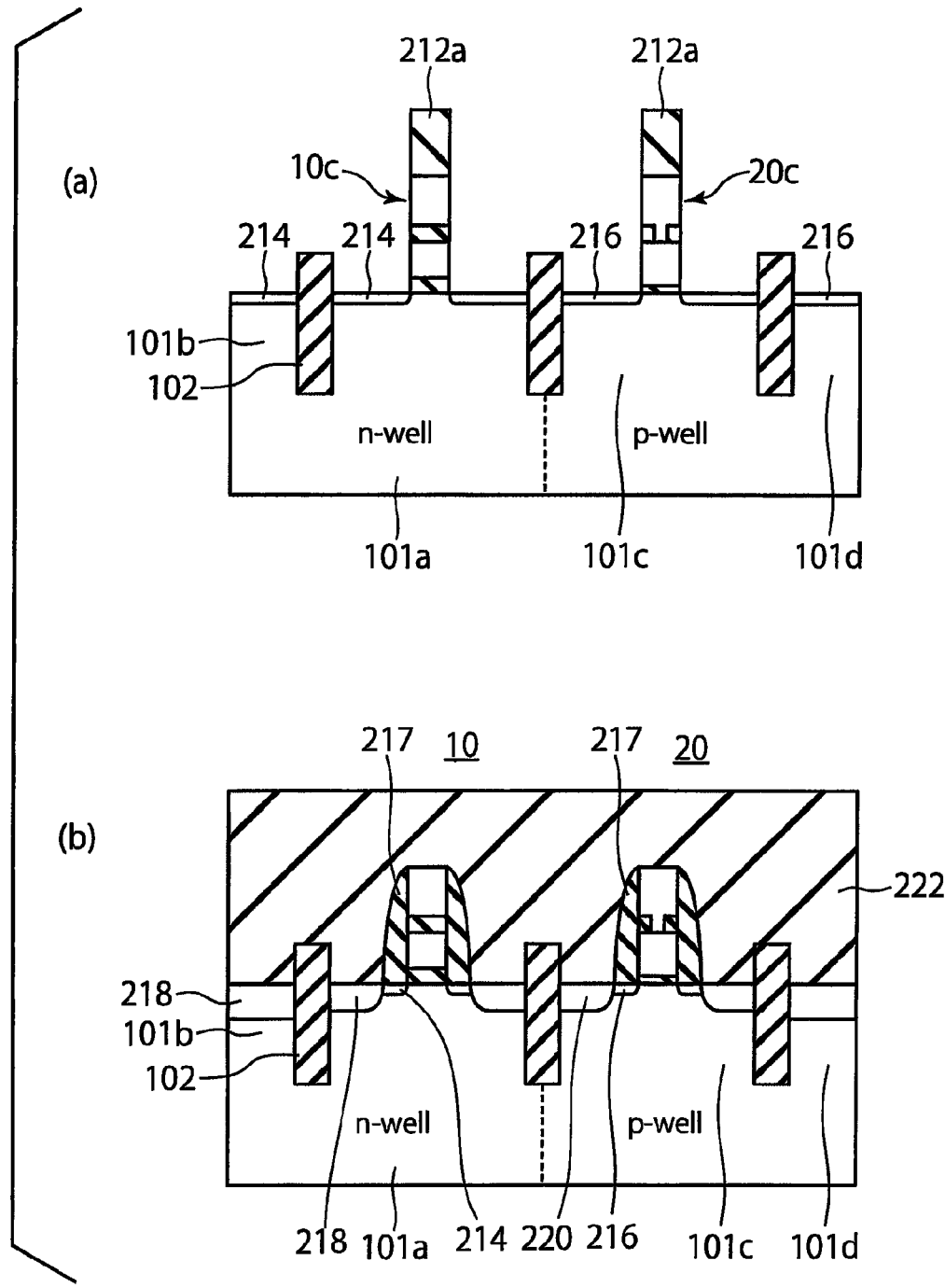

In the layout of the specific example shown in FIG. 12, the memory cell transistors 10 and the pass transistors 20 have the same gate width W. Normally, to restrain RC delays of signals in a nonvolatile programmable logic switch, the pass transistors 20 preferably have low ON resistance values. In such a case, as in the layout of another specific example shown in FIG. 13, each pass transistor 20 is formed by MOSFETs (five MOSFETs in FIG. 13) that share one of the source 20a and the drain 20b, and are connected to a gate $20c_2$. With this arrangement, the gate width of each pass transistor 20 is 5 W, which is five times greater than the gate width W of each memory cell transistor 10, and accordingly, the ON resistance value can be made lower. In the other specific example, the unit cells 1 are arranged in a matrix form, and the memory cell transistors 10 of the unit cells 1 of the same column are positioned so as to share a gate $10c_4$. The pass transistor 20 of each unit cell 1 and the memory cell transistor 10 in the same unit cell 1 are arranged in the same row. In the layout shown in FIG. 13, as in the later described second embodiment, it is particularly preferable to use n-channel FETs as the memory cell transistors 10 and p-channel FETs as the pass transistors 20. This is because a p-channel FET has a smaller ON current or a higher ON resistance value than an n-channel FET of the same size as the p-channel FET, and accordingly, a large ON current can be achieved by making the device width greater as in the layout shown in FIG. 13.

Referring now to FIGS. 14(a) through 19(b), a method of manufacturing the nonvolatile programmable logic switch of this embodiment is described.

In the following description, devices are to be formed on a p-type Si substrate of the plane direction (100) with an impurity density of approximately $5 \times 10^{15}$ cm$^{-3}$.

First, patterning is performed on a p-type Si substrate 100, to form Shallow Trench Isolations (STIs) to be the device isolation regions 102, and grooves of approximately 200 nm in depth (not shown) are formed in the Si substrate 100. A Tetra Ethyl Ortho Silicate (TEOS) film is deposited in each of the grooves, to form the STIs 102. After that, a sacrifice oxide film 201 made of $SiO_2$ is formed on the surface of the Si substrate 100 through a thermal oxidation process (FIG. 14(a)). The left half of the Si substrate 100 shown in FIG. 14(a) is to be the memory cell transistor formation region, and the right half is to be the pass transistor formation region. A resist is then applied onto the substrate 100, and patterning is performed on the resist, to form a resist pattern 202 with the resist remaining on the pass transistor formation region. With the resist pattern 202 serving as a mask, ions of an n-type impurity such as P (phosphorus) or As (arsenic) are implanted, to form the n-well region 101a (FIG. 14(a)).

After the resist pattern 202 is removed, a resist pattern 203 covering the n-well region 101a is formed. With the resist pattern 203 serving as a mask, ions of a p-type impurity such as B (boron) are implanted, to form the p-well region 101c (FIG. 14(b)). After the resist pattern 203 is removed, the impurities in the n-well regions 101a and 101b, and the p-well regions 101c and 101d are activated through a thermal process.

The sacrifice oxide film 201 is then removed, and the oxide film $20c_1$ of several nanometers in thickness is formed as the gate insulating film for the pass transistor (FIG. 15(a)).

In this embodiment, the gate insulating films of the memory cell transistor and the pass transistor are required to have different thicknesses from each other. Therefore, a resist pattern 204 having an opening to expose the memory cell transistor formation region or the n-well region 101a through its bottom is formed. With the resist pattern 204 serving as a mask, the gate insulating film $20c_1$ for the pass transistor is removed from the n-well region 101a. A tunnel insulating film $10c_1$ that has a thickness of approximately 8 nm and is made of $SiO_2$, for example, is then formed on the n-well region 101a (FIG. 15(b)). Accordingly, as shown in FIG. 15(b), the tunnel insulating film $10c_1$ and the gate insulating film $20c_1$ having different thicknesses from each other can be formed. Although the tunnel insulating film $10c_1$ and the gate insulating film $20c_1$ are made of $SiO_2$ in this example, the tunnel insulating film $10c_1$ and the gate insulating film $20c_1$ may be silicon nitride films nitrided by NO, $NH_3$, or the like, or may be high-k films.

In this embodiment, the gate electrodes of the memory cell transistor and the pass transistor have different structures from each other. That is, while the memory cell transistor includes a floating gate as well as a control gate, the pass transistor includes only a conventional gate electrode.

Through the following processes, transistors having such structures as to have different gates between the regions can be formed.

First, after the resist pattern 204 is removed, a polysilicon film 206 is deposited on the entire surface, so as to cover the gate insulating films $10c_1$ and $20c_1$, and ions of an n-type impurity such as P are then implanted into the polysilicon film 206, as shown in FIG. 16(a). Although the polysilicon film having the n-type impurity introduced thereinto is formed by implanting ions of the n-type impurity after the polysilicon film 206 is deposited, a polysilicon film already having an n-type impurity introduced thereinto may be deposited. An insulating film 208 made of $SiO_2$, $Si_3N_4$, $Al_2O_3$, or the like, is then formed on the polysilicon film 206 (FIG. 16(b)). This insulating film 208 is to serve as the block insulating film of the memory cell transistor.

As shown in FIG. 17(a), the portion of the insulating film 208 on which the gate electrode of the pass transistor is to be formed is removed by etching, and an opening 209 reaching the polysilicon film 206 is formed. A polysilicon film 210 having an n-type impurity such as P introduced thereinto is then formed to cover the insulating film 208 (FIG. 17(b)). This polysilicon film 210 is to serve as the control gate of the memory cell transistor and the gate electrode of the pass transistor.

A hard mask material film 212 made of $Si_3N_4$, for example, is then deposited to cover the polysilicon film 210 (FIG. 18(a)). Patterning is then performed on the hard mask material film 212 by a lithography technique, to form a hard mask 212a defining the shapes of the control gate of the memory cell transistor and the gate of the pass transistor. With the use of the hard mask 212a, patterning is performed on the polysilicon film 210, the insulating film 208, the polysilicon film 206, the tunnel insulating film $10c_1$, and the gate insulating film $20c_1$, to form the gate structure 10c of the memory cell transistor and the gate structure 20c of the pass transistor (FIG. 18(b)). The gate structure 10c includes the tunnel insulating film $10c_1$, the floating gate $10c_2$, the block insulating film (or an interelectrode insulating film) $10c_3$, and the control gate $10c_4$. The gate structure 20c includes the gate insulating film $20c_1$ and the gate electrode $20c_2$.

With the hard mask 212a serving as a mask, p$^-$-type impurity regions 214 are formed in the n-well regions 101a and 101b, and n$^-$-type impurity regions 216 are formed in the p-well regions 101c and 101d (FIG. 19(a)). After the hard mask 212a is removed, gate sidewalls 217 made of an insulator are formed on the sides of each of the gate structures 10c and 20c. With the gate structures 10c, 20c, and the gate sidewalls 217 serving as masks, p$^+$-type impurity regions 218 are formed in the n-well regions 101a and 101b, and n$^+$-type impurity regions 220 are formed in the p-well regions 101c and 101d (FIG. 19(b)). The p$^-$-type impurity region 214 and the p$^+$-type impurity region 218 in the n-well region 101a are to serve as the source and drain of the memory cell transistor, and the p$^+$-type impurity region 218 in the n-well region 101b is to serve as the terminal for applying a substrate bias voltage to the n-well regions 101a and 101b. Also, the n$^-$-type impurity region 216 and the n$^+$-type impurity region 220 in the p-well region 101c are to serve as the source and drain of the pass transistor, and the n$^+$-type impurity region 220 in the p-well region 101d is to serve as the terminal for applying a substrate bias voltage to the p-well regions 101c and 101d. After the formation, the p$^-$-type impurity region 214, the p$^+$-type impurity region 218, the n$^-$-type impurity region 216, and the n$^+$-type impurity region 220 are subjected to a thermal treatment and are activated.

After that, an interlayer insulating film 222 is deposited, and an opening (not shown) is formed in the interlayer insulating film 222. The opening is filled with a metal, to form the wire (not shown) connecting the drain of the memory cell transistor 10 and the gate of the pass transistor 20. In this manner, the nonvolatile programmable logic switch of this embodiment is completed.

Although the control gates and the floating gate are both made of n-type polysilicon in this embodiment, the floating gate may be made of n-type polysilicon, and the control gates may be made of p-type polysilicon or metal gates. In this case, the manufacture method becomes somewhat more complicated than that of this embodiment.

In this embodiment, when the pass transistor 20 is operating, a voltage of 0 V for switching off the pass transistor 20 is applied to the impurity region 10a of the memory cell transistor 10 (see FIG. 6). Also, by virtue of the capacitance coupling between the substrate or floating gate of the memory cell transistor 10 and the impurity region connected to the gate electrode of the pass transistor 20, the gate potential of the pass transistor 20 can be maintained at the potential $V_{DD}$ at which the pass transistor 20 is switched on (see FIG. 7).

As described above, according to this embodiment, cell units each including the two transistors of a memory cell transistor and a pass transistor are the smallest component units. Thus, the circuit size can be made smaller.

In this embodiment, n-type polysilicon is used for the floating gate, and accordingly, programming and erasing require short periods of time. In this embodiment, n-type polysilicon is used for the floating gate, and program and erase operations are performed with electronic currents. Since the cell units are the same as general memory cells, a highly-reliable nonvolatile programmable logic switch can be realized. Also, positive voltages can be used as the program and erase voltages.

(Modification)

A nonvolatile programmable logic switch according to a modification of the first embodiment is now described. In the nonvolatile programmable logic switch of the first embodiment, the floating gate $10c_2$ and the control gate $10c_4$ of the memory cell transistor 10 are made of n-type polysilicon. In the nonvolatile programmable logic switch of this modification, on the other hand, the floating gate $10c_2$ of the memory cell transistor 10 is made of p-type polysilicon. As in the first embodiment, the memory cell transistor 10 is a p-channel MOSFET, and the pass transistor 20 is an n-channel MOSFET.

In this modification, only the conditions for program operations and erase operations of the memory cell transistor 10 are different from those in the first embodiment, and the conditions for operations of the pass transistor 20 are the same as those of the first embodiment shown in FIGS. 6 and 7.

In program operations of the memory cell transistor 10 in this modification, a voltage $V_{CG}$ (<0) is applied to the control gate $10c_4$ of the memory cell transistor 10, and the voltage $V_{SUB}$ to be applied to the substrate bias electrode 8 is set at 0 V. Holes are then injected into the floating gate $10c_2$ from the inversion layer formed in the channel of the memory cell transistor 10.

In erase operations, the voltage $V_{CG}$ of the control gate $10c_4$ of the memory cell transistor 10 is set at 0 V, and the voltage $V_{SUB}$ to be applied to the substrate bias electrode 8 is set at a negative value. Electrons are then injected into the floating gate $10c_2$, to erase the holes.

In this modification, during an operation of the pass transistor 20, the voltage of 0 V for switching off the pass transistor 20 is applied to the impurity region 10a of the memory cell transistor 10 as in the first embodiment. Also, by virtue of the capacitance coupling between the substrate or floating gate of the memory cell transistor 10 and the impurity region 10b connected to the gate electrode of the pass transistor 20, the gate potential of the pass transistor 20 can be maintained at the potential $V_{DD}$ at which the pass transistor 20 is switched on (see FIG. 7).

In this modification, cell units each including the two transistors of a memory cell transistor and a pass transistor are the smallest component units as in the first embodiment. Thus, the circuit size can be made smaller.

In this modification, the floating gate is made of p-type polysilicon, and therefore, the constraints in the processes are smaller than those in the first embodiment. In this modification, p-type polysilicon is used for the floating gate, and the floating gate is of the same conductivity as that of the diffusion layer (also being of the p-type) of each memory cell. Accordingly, a nonvolatile programmable logic switch can be realized through self-alignment.

Second Embodiment

Figure 20:
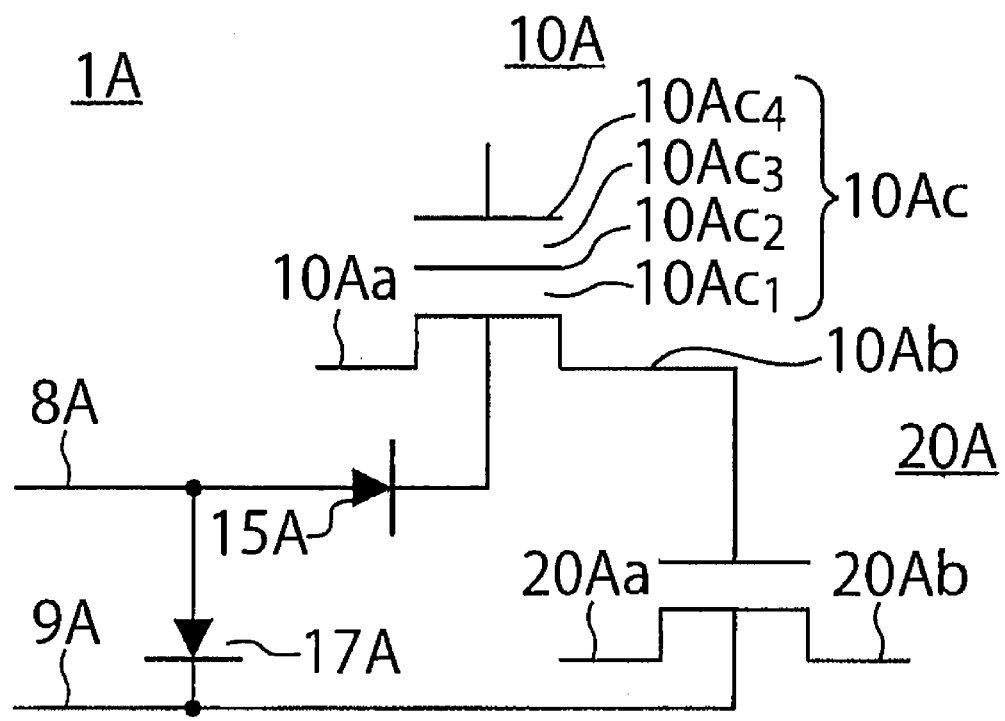
FIG. 20 is a circuit diagram showing a logic switch according to a second embodiment.

FIG. 20 shows a nonvolatile programmable logic switch according to a second embodiment. The nonvolatile programmable logic switch 1A of the second embodiment differs from the nonvolatile programmable logic switch 1 of the first embodiment shown in FIG. 1, in that the p-channel memory cell transistor 10 and the n-channel pass transistor 20 are replaced with an n-channel memory cell transistor 10A and a p-channel pass transistor 20A. Accordingly, the memory cell transistor 10A is formed in a p-well region, and the pass transistor 20A is formed in an n-well region. Therefore, the pn junctions 15 and 17 are replaced with pn junctions 15A and 17A, respectively, and the p-type impurity region 8 and the n-type impurity region 9 are replaced with an n-type impurity region 8A and a p-type impurity region 9A, respectively.

The memory cell transistor 10A includes a source 10Aa, a drain 10Ab, and a gate structure 10Ac. The gate structure 10Ac includes a tunnel insulating film $10Ac_1$ formed in a p-well region serving as the channel between the source 10Aa and the drain 10Ab, a floating gate $10Ac_2$ made of n-type polysilicon, an interelectrode insulating film $10Ac_3$, and a control gate $10Ac_4$ made of n-type polysilicon.

The pass transistor 20A includes a source 20Aa, a drain 20Ab, and a gate structure 20Ac. The gate structure 20Ac includes a gate insulating film $20Ac_1$ and a gate electrode $20Ac_2$. The gate electrode $20Ac_2$ is connected to the drain 10Ab of the memory cell transistor 10A.

In program operations of the memory cell transistor 10A in the second embodiment, a voltage $V_{CG}$ (>0) is applied to the control gate of the memory cell transistor 10A, and the voltage $V_{SUB}$ to be applied to the substrate bias electrode 8A is set at 0 V. Electrons are then injected into the floating gate $10Ac_2$ from the inversion layer formed in the channel in the memory cell transistor 10A.

In erase operations, the voltage $V_{CG}$ of the control gate of the memory cell transistor 10A is set at 0 V, and the voltage $V_{SUB}$ to be applied to the substrate bias electrode 8A is set at a positive value. Electrons are then erased from the floating gate $10Ac_2$.

In the second embodiment, while the pass transistor 20A is operating, a voltage VDD for switching off the pass transistor 20A is applied to the impurity region 10Aa of the memory cell transistor 10A. Also, by virtue of the capacitance coupling between the substrate (the well regions) or floating gate of the memory cell transistor 10A and the impurity region connected to the gate electrode of the pass transistor 20A, the gate potential of the pass transistor 20A can be maintained at the potential (=0 V) at which the pass transistor 20A is switched on.

In the second embodiment, cell units each including the two transistors of a memory cell transistor and a pass transistor are also the smallest component units as in the first embodiment. Thus, the circuit size can be made smaller.

In the second embodiment, the floating gate is made of n-type polysilicon, and therefore, constrains in the processes are small. In this embodiment, n-type polysilicon is used for the floating gate, and program and erase operations are performed with electronic currents from an inversion layer. Since this is the same process based on the same operating principles as those of general memory cells, a highly-reliable nonvolatile programmable logic switch can be realized. Also, positive voltages can be used as the program and erase voltages.

(Modification)

A nonvolatile programmable logic switch according to a modification of the second embodiment is now described. In the nonvolatile programmable logic switch of the second embodiment, the floating gate $10Ac_2$ and the control gate $10Ac_4$ of the memory cell transistor 10A are made of n-type polysilicon. In the nonvolatile programmable logic switch of this modification, on the other hand, the floating gate $10Ac_2$ of the memory cell transistor 10a is made of p-type polysilicon. As in the second embodiment, the memory cell transistor 10A is an n-channel MOSFET, and the pass transistor 20A is a p-channel MOSFET.

In program operations of the memory cell transistor 10A in this modification, a voltage $V_{CG}$ (<0) is applied to the control gate $10Ac_4$ of the memory cell transistor 10A, and the voltage $V_{SUB}$ to be applied to the substrate bias electrode 8A is set at 0 V. Holes are then injected into the floating gate $10Ac_2$ from the p-well region.

In erase operations, the voltage $V_{CG}$ of the control gate $10Ac_4$ of the memory cell transistor 10A is set at 0 V, and the voltage $V_{SUB}$ (<0) is applied to the substrate bias electrode 8. Electrons are then injected into the floating gate $10Ac_2$, to erase the holes.

In this modification, during an operation of the pass transistor 20A, the voltage of 0 V for switching off the pass transistor 20A is applied to the impurity region 10Aa of the memory cell transistor 10A as in the first embodiment. Also, by virtue of the capacitance coupling between the substrate or floating gate of the memory cell transistor 10A and the impurity region connected to the gate electrode of the pass transistor 20A, the gate potential of the pass transistor 20A can be maintained at the potential $V_{DD}$ at which the pass transistor 20A is switched on (see FIG. 7).

In this modification, cell units each including the two transistors of a memory cell transistor and a pass transistor are the smallest component units as in the second embodiment. Thus, the circuit size can be made smaller.

In this modification, the floating gate is made of p-type polysilicon, and therefore, the constraints in the processes are smaller than those in the first embodiment. In this modification, p-type polysilicon is used for the floating gate, and the floating gate is of the same conductivity as that of the diffusion layer (also being of the p-type) of each memory cell. Accordingly, a nonvolatile programmable logic switch can be realized through self-alignment.

For reference, FIG. 21 shows a list of the program voltages and the erase voltages in the memory cell transistors of the first and second embodiments and their modifications. In FIG. 21, $V_{CG}$ represents the voltages to be applied to the control gates of the memory cell transistors 10 and 10A, and $V_{SUB}$ represents the voltages to be applied to the substrate bias electrodes 8 and 8A of the memory cell transistors 10 and 10A.

Third Embodiment

Figure 22:
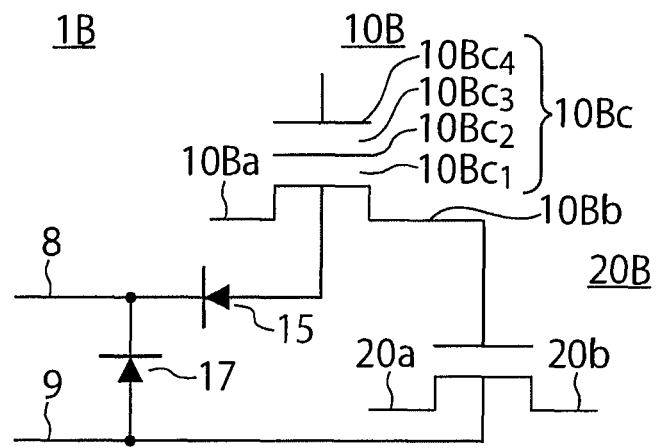
FIG. 22 is a circuit diagram showing a logic switch according to a third embodiment.

FIG. 22 shows a nonvolatile programmable logic switch according to a third embodiment. In each of the nonvolatile programmable logic switches of the first embodiment shown in FIG. 1 and the second embodiment shown in FIG. 20, the charge storage film $10c_2$ ($10Ac_2$) of the memory cell transistor is a floating gate. The nonvolatile programmable logic switch 1B of the third embodiment has the same structure as that of the first embodiment shown in FIG. 1, except that the charge storage film of the memory cell transistor is replaced with a charge trap film containing a nitride film, for example. That is, the memory cell transistor of the third embodiment has a Metal-Oxide-Nitride-Oxide-Semiconductor (MONOS) gate structure.

More specifically, the nonvolatile programmable logic switch 1B of the third embodiment includes a p-channel memory cell transistor 10B and an n-channel pass transistor 20. The memory cell transistor 10B includes a source region 10Ba, a drain region 10Bb, and a gate structure 10Bc. The gate structure 10Bc includes a tunnel insulating film $10Bc_1$ formed in an n-well region serving as the channel between the source region 10Ba and the drain region 10Bb, a charge trap film $10Bc_2$, a block insulating film $10Bc_3$, and a control gate $10Bc_4$ made of n-type polysilicon. It should be noted that the pass transistor 20 has the same structure as that of the first embodiment.

In the third embodiment, the memory cell transistor 10B is a p-channel MOSFET. Therefore, in program operations, a voltage $V_{CG}$ (<0) is applied to the control gate $10Bc_4$ of the memory cell transistor 10B, and the voltage $V_{SUB}$ to be applied to the substrate bias electrode 8 is set at 0 V. Holes are then injected into the charge trap film $10Bc_2$ from the inversion layer formed in the n-well region.

In erase operations, the voltage $V_{CG}$ of the control gate $10Bc_4$ of the memory cell transistor 10B is set at 0 V, and the voltage $V_{SUB}$ (<0) is applied to the substrate bias electrode 8. Electrons are then injected into the charge trap film $10Bc_2$, to erase the holes.

In the third embodiment, the voltage of 0 V is applied to the impurity region 10Ba of the memory cell transistor 10B to put the pass transistor 20 into a non-conduction state, and the drive voltage $V_{DD}$ is applied to the impurity region 10Ba of the memory cell transistor 10B to put the pass transistor 20 into a conduction state, as in the first embodiment.

In the third embodiment, cell units each including the two transistors of a memory cell transistor and a pass transistor are also the smallest component units as in the first embodiment. Thus, the circuit size can be made smaller.

Fourth Embodiment

Figure 23:
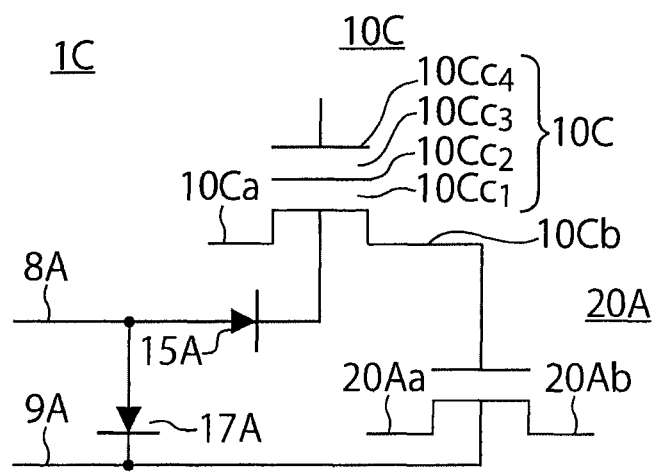
FIG. 23 is a circuit diagram showing a logic switch according to the third embodiment.

FIG. 23 shows a nonvolatile programmable logic switch according to a fourth embodiment. The nonvolatile programmable logic switch 1C of the fourth embodiment has the same structure as that of the second embodiment shown in FIG. 20, except that the charge storage film of the memory cell transistor is replaced with a charge trap film containing a nitride film, for example. That is, the memory cell transistor of the fourth embodiment has a Metal-Oxide-Nitride-Oxide-Semiconductor (MONOS) gate structure.

More specifically, the nonvolatile programmable logic switch 1C of the fourth embodiment includes an n-channel memory cell transistor 10C and a p-channel pass transistor 20A. The memory cell transistor 10C includes a source region 10Ca, a drain region 10Cb, and a gate structure 10Cc. The gate structure 10Cc includes a tunnel insulating film $10Cc_1$ formed in a p-well region serving as the channel between the source region 10Ca and the drain region 10Cb, a charge trap film $10Cc_2$, a block insulating film $10Cc_3$, and a control gate $10Cc_4$ made of n-type polysilicon. It should be noted that the pass transistor 20A has the same structure as that of the second embodiment.

In the fourth embodiment, the memory cell transistor 10C is an n-channel MOSFET. Therefore, in program operations, a voltage $V_{CG}$ (>0) is applied to the control gate $10Cc_4$ of the memory cell transistor 10C, and the voltage $V_{SUB}$ to be applied to the substrate bias electrode 8A is set at 0 V. Electrons are then injected into the charge trap film $10Cc_2$ from the inversion layer formed in the p-well region.

In erase operations, the voltage $V_{CG}$ of the control gate $10Cc_4$ of the memory cell transistor 10C is set at 0 V, and the voltage $V_{SUB}$ (>0) is applied to the substrate bias electrode 8A. Electrons are then erased from the charge trap film $10Cc_2$.

In the fourth embodiment, the drive voltage $V_{DD}$ is applied to the impurity region 10Ca of the memory cell transistor 10C to put the pass transistor 20A into a non-conduction state, and the voltage of 0 V is applied to the impurity region 10Ca of the memory cell transistor 10C to put the pass transistor 20A into a conduction state, as in the second embodiment.

In the fourth embodiment, cell units each including the two transistors of a memory cell transistor and a pass transistor are also the smallest component units as in the second embodiment. Thus, the circuit size can be made smaller.

For reference, FIG. 24 shows a list of the program voltages and the erase voltages in the memory cell transistors of the above described third and fourth embodiments. In FIG. 24, $V_{CG}$ represents the voltages to be applied to the control gates of the memory cell transistors 10B and 10C, and $V_{SUB}$ represents the voltages to be applied to the substrate bias electrodes 8 and 8A of the memory cell transistors 10B and 10C.

As a unit cell, the nonvolatile programmable logic switch according to any of the second embodiment and its modification, the third embodiment, and the fourth embodiment can be used to form a semiconductor integrated circuit having unit cells arranged in a matrix form, as described in the first embodiment.

While certain embodiments have been described, these embodiments have been presented by way of example only, and are not intended to limit the scope of the inventions. Indeed, the novel methods and systems described herein can be embodied in a variety of other forms; furthermore, various omissions, substitutions and changes in the form of the methods and systems described herein can be made without departing from the spirit of the inventions. The accompanying claims and their equivalents are intended to cover such forms or modifications as would fall within the scope and spirit of the inventions.

What is claimed is:

1. A nonvolatile programmable logic switch comprising:
    a device isolation region formed in a semiconductor substrate;
    a first semiconductor region of a first conductivity type and a second semiconductor region of a second conductivity type, the first semiconductor region and the second semiconductor region being formed in the semiconductor substrate, an upper part of the first semiconductor region and an upper part of the second semiconductor region being isolated from each other by the device isolation region, and a lower part of the first semiconductor region and a lower part of the second semiconductor region contacting each other;
a memory cell transistor including:
 a first source region and a first drain region formed in the first semiconductor region, the first source region and the first drain region being of the second conductivity type;
 a first insulating film formed on a portion of the first semiconductor region, the portion being located between the first source region and the first drain region;
 a charge storage film formed on the first insulating film;
 a second insulating film formed on the charge storage film; and
 a control gate formed on the second insulating film;
a pass transistor including:
 a second source region and a second drain region formed in the second semiconductor region, the second source region and the second drain region being of the first conductivity type;
 a third insulating film formed on a portion of the second semiconductor region, the portion being located between the second source region and the second drain region; and
 a gate electrode formed on the third insulating film, the gate electrode being electrically connected to the first drain region;
a first electrode applying a substrate bias to the first semiconductor region, the first electrode being formed in the first semiconductor region; and
a second electrode applying a substrate bias to the second semiconductor region, the second electrode being formed in the second semiconductor region.

2. The switch according to claim 1, wherein, when the pass transistor is activated, a power supply voltage for putting the pass transistor into a conduction or non-conduction state is connected to the first source region of the memory cell transistor.

3. The switch according to claim 1, wherein the charge storage film is a polysilicon film of the second conductivity type.

4. The switch according to claim 1, wherein the charge storage film is a polysilicon film of the first conductivity type.

5. The switch according to claim 1, wherein the charge storage film is a charge trap film.

6. A semiconductor integrated circuit comprising
a plurality of unit cells arranged in a matrix form, each of the unit cells comprising a nonvolatile programmable logic switch comprising:
 a device isolation region formed in a semiconductor substrate;
 a first semiconductor region of a first conductivity type and a second semiconductor region of a second conductivity type, the first semiconductor region and the second semiconductor region being formed in the semiconductor substrate, an upper part of the first semiconductor region and an upper part of the second semiconductor region being isolated from each other by the device isolation region, and a lower part of the first semiconductor region and a lower part of the second semiconductor region contacting each other;
 a memory cell transistor including:
  a first source region and a first drain region formed in the first semiconductor region, the first source region and the first drain region being of the second conductivity type;
  a first insulating film formed on a portion of the first semiconductor region, the portion being located between the first source region and the first drain region;
  a charge storage film formed on the first insulating film;
  a second insulating film formed on the charge storage film; and
  a control gate formed on the second insulating film;
 a pass transistor including:
  a second source region and a second drain region formed in the second semiconductor region, the second source region and the second drain region being of the first conductivity type;
  a third insulating film formed on a portion of the second semiconductor region, the portion being located between the second source region and the second drain region; and
  a gate electrode formed on the third insulating film, the gate electrode being electrically connected to the first drain region;
 a first electrode applying a substrate bias to the first semiconductor region, the first electrode being formed in the first semiconductor region; and
 a second electrode applying a substrate bias to the second semiconductor region, the second electrode being formed in the second semiconductor region.

7. The circuit according to claim 6, when the pass transistor is activated, a power supply voltage for putting the pass transistor into a conduction or non-conduction state is connected to the first source region of the memory cell transistor.

8. The circuit according to claim 6, wherein the charge storage film is a polysilicon film of the second conductivity type.

9. The circuit according to claim 6, wherein the charge storage film is a polysilicon film of the first conductivity type.

10. The circuit according to claim 6, wherein the charge storage film is a charge trap film.

* * * * *